(12) United States Patent
    Otsuki et al.

(10) Patent No.: US 11,262,374 B2
(45) Date of Patent: Mar. 1, 2022

(54) SENSOR UNIT, METHOD OF MANUFACTURING SENSOR UNIT, INERTIAL MEASUREMENT DEVICE, ELECTRONIC APPARATUS, AND VEHICLE

(71) Applicant: Seiko Epson Corporation, Tokyo (JP)

(72) Inventors: Tetsuya Otsuki, Fujimi (JP); Masataka Kazuno, Kofu (JP)

(73) Assignee: Seiko Epson Corporation

( * ) Notice: Subject to any disclaimer, the term of this patent is extended or adjusted under 35 U.S.C. 154(b) by 483 days.

(21) Appl. No.: 16/194,851

(22) Filed: Nov. 19, 2018

(65) Prior Publication Data
    US 2019/0162745 A1    May 30, 2019

(30) Foreign Application Priority Data

Nov. 24, 2017  (JP) .............................. JP2017-225489

(51) Int. Cl.
    *G01P 1/02*      (2006.01)
    *G05D 1/08*      (2006.01)
    (Continued)

(52) U.S. Cl.
    CPC ............ *G01P 1/023* (2013.01); *B60W 30/02* (2013.01); *G01C 19/5783* (2013.01);
    (Continued)

(58) Field of Classification Search
    CPC .......... B60W 2710/18; B60W 2710/22; G05D 2201/0213; H01L 2924/00
    (Continued)

(56) References Cited

U.S. PATENT DOCUMENTS 4,829,822 A * 5/1989 Imai ....................... G01P 1/003
                                                          338/5
4,969,359 A * 11/1990 Mikkor ............... G01P 15/0802
                                                         338/46
(Continued)

FOREIGN PATENT DOCUMENTS

JP          07225240 A  *  8/1995
JP        H08-115991 A      5/1996
(Continued)

OTHER PUBLICATIONS

Translation JP-07225240-A (Year: 2007).*

*Primary Examiner* — Alexander A Mercado
*Assistant Examiner* — Monica S Young
(74) *Attorney, Agent, or Firm* — Harness, Dickey & Pierce, P.L.C.

(57) ABSTRACT

A sensor unit includes a plurality of terminal members each of which includes a lead portion and an external terminal portion having an external connection end face, a sensor device connected to the lead portions, and a resin member that covers the sensor device and a part of the plurality of terminal members. The lead portion includes a thin wall portion having a thickness thinner than the external terminal portion and a protruding portion protruding from the thin wall portion to an external connection end face side. In a plan view from a direction where the terminal member and the sensor device overlap, the sensor device is disposed at a position overlapping the protruding portion and not overlapping the external terminal portion.

19 Claims, 21 Drawing Sheets

(51) Int. Cl.
*B60W 30/02* (2012.01)
*G01C 19/5783* (2012.01)
*G01P 15/18* (2013.01)

(52) U.S. Cl.
CPC ............ *G01P 15/18* (2013.01); *G05D 1/0891* (2013.01); *B60W 2420/905* (2013.01); *B60W 2710/18* (2013.01); *B60W 2710/22* (2013.01); *G05D 2201/0213* (2013.01); *H01L 2924/00* (2013.01)

(58) Field of Classification Search
USPC .......................................................... 73/512
See application file for complete search history.

(56) References Cited

U.S. PATENT DOCUMENTS

| | | | |
|---|---|---|---|
| 5,396,795 A * | 3/1995 | Araki | G01F 1/684 257/E21.504 |
| 5,656,550 A | 8/1997 | Tsuji et al. | |
| 5,801,435 A * | 9/1998 | Otsuki | H01L 23/4334 257/675 |
| 6,025,650 A | 2/2000 | Tsuji et al. | |
| 6,060,768 A | 5/2000 | Hayashida et al. | |
| 6,060,780 A * | 5/2000 | Ohta | G01P 1/023 257/731 |
| 6,078,123 A * | 6/2000 | Tanaka | G01N 29/022 310/313 R |
| 6,255,740 B1 | 7/2001 | Tsuji et al. | |
| 6,553,829 B1 * | 4/2003 | Nakada | G01F 1/6845 73/204.26 |
| 7,150,189 B2 | 12/2006 | Tanaka | G01F 1/6845 73/204.26 |
| 7,217,991 B1 * | 5/2007 | Davis | H01L 23/3107 257/666 |
| 8,304,864 B2 * | 11/2012 | San Antonio | H01L 23/49838 257/666 |
| 10,634,498 B2 * | 4/2020 | Ide | G01C 19/5642 |
| 2002/0158347 A1 * | 10/2002 | Yagi | H01L 23/3107 257/787 |
| 2003/0209787 A1 * | 11/2003 | Kondo | H01L 27/14618 257/673 |
| 2008/0174012 A1 * | 7/2008 | Otsuki | H01L 21/568 257/737 |
| 2009/0050990 A1 * | 2/2009 | Aono | G01P 15/125 257/415 |
| 2009/0183568 A1 * | 7/2009 | Yamanaka | B81B 7/02 73/504.04 |
| 2010/0193923 A1 * | 8/2010 | Tanaka | H01L 21/565 257/676 |
| 2010/0242603 A1 * | 9/2010 | Miller | G01P 15/125 73/514.32 |
| 2012/0079882 A1 * | 4/2012 | Chiba | B81B 7/0006 73/514.29 |
| 2012/0080763 A1 * | 4/2012 | Hanaoka | H01L 27/0207 257/415 |
| 2012/0105080 A1 | 5/2012 | Iwasawa et al. | |
| 2012/0180566 A1 * | 7/2012 | Matsunaga | G01P 1/023 73/504.08 |
| 2012/0304769 A1 * | 12/2012 | Watanabe | G01P 15/0802 73/514.01 |
| 2012/0318059 A1 * | 12/2012 | Otsuki | H01L 23/057 73/504.12 |
| 2013/0026583 A1 * | 1/2013 | Matsukawa | G01C 19/5783 257/415 |
| 2013/0192367 A1 * | 8/2013 | Osawa | G01C 19/5733 73/504.12 |
| 2014/0123754 A1 * | 5/2014 | Watanabe | G01P 1/023 73/514.01 |
| 2015/0221783 A1 * | 8/2015 | Tsukagoshi | H01L 31/02325 257/432 |
| 2017/0236772 A1 | 8/2017 | Yamagami | |

FOREIGN PATENT DOCUMENTS

| | | |
|---|---|---|
| JP | H08-306853 A | 11/1996 |
| JP | 2001-332675 A | 11/2001 |
| JP | 2005-039780 A | 2/2005 |
| JP | 2008-309594 A | 12/2008 |
| JP | 2011-053020 A | 3/2011 |
| JP | 2017-147272 A | 8/2017 |

* cited by examiner

SENSOR UNIT, METHOD OF MANUFACTURING SENSOR UNIT, INERTIAL MEASUREMENT DEVICE, ELECTRONIC APPARATUS, AND VEHICLE

CROSS-REFERENCE

The entire disclosure of Japanese Patent Application No. 2017-225489, filed Nov. 24, 2017 is expressly incorporated by reference herein.

BACKGROUND

1. Technical Field

The present invention relates to a sensor unit, a method of manufacturing the sensor unit, an inertial measurement device, an electronic apparatus, and a vehicle.

2. Related Art

In the related art, a resin sealing type electronic device is used, in which electronic components such as semiconductor elements connected to lead portions are packaged by resin sealing. As such a resin sealing type electronic device, for example, JP-A-2001-332675 discloses a resin sealing type semiconductor device using the semiconductor elements as the electronic components.

The resin sealing type semiconductor device in JP-A-2001-332675 includes a terminal member that includes an internal terminal portion that is electrically connected to a terminal of the semiconductor element, an external terminal portion that is connection to an external circuit, a lead portion integrally connecting the internal terminal portion and the external terminal portion. In the terminal member, the internal terminal portion and the external terminal portion are provided separately on the front and back surfaces, and the internal terminal portion and the lead portion are formed thin, and the external terminal portion is formed thick. In addition, a plurality of terminal members are disposed independently of each other, and terminal faces of the internal terminal portions of the respective terminal members are disposed in the same direction on one plane to configure a circuit portion. The face on the terminal portion side of the semiconductor element and the face on the internal terminal portion side of the circuit portion are facing each other, and the semiconductor element is bonded or contacted to the face of the terminal face side of the internal terminal portion at the terminal portion of the semiconductor element, and thus, the terminal portion of the semiconductor element and the internal terminal portion of the circuit portion are electrically connected. The semiconductor element and the internal terminal portion, and the like are packaged by resin sealing.

However, when the resin sealing type semiconductor device described in JP-A-2001-332675 is applied to a sensor unit in which the sensor device or the like is embedded, the external connection portion is disposed not on an outer edge portion (end portion along a contour) of the sensor unit formed by the resin, but on the area inside the outer edge portion. When such a sensor unit is electrically connected (soldering or the like) to a substrate, there is a problem in that it is difficult to confirm the presence or absence of a problem in the connection, and in the resin packaged sensor units, expansion and shrinkage of the resin are increased by a change of temperature occurring when the electrical connection or the fixation to the mounting substrate is performed or the change of the temperature due to the using environment, and thus, the stress is likely to be applied to the inside of the resin. Therefore, there are concerns that the stress due to the expansion and the shrinkage of this resin is concentrated on the embedded sensor device, and thus, the accuracy of measurement performed by the sensor device deteriorates, and defects may occur in the connection portion of the sensor device inside the resin package.

SUMMARY

An advantage of some aspects of the invention is to solve at least a part of the problems described above, and the invention can be implemented as the following forms or application examples.

Application Example 1

A sensor unit according to this application example includes a plurality of terminal members each of which includes a lead portion and an external terminal portion having an external connection end face, a sensor device connected to the lead portions of the plurality of terminal members, and a resin member that covers the sensor device and a part of the plurality of terminal members. The lead portion includes a thin wall portion having a thickness thinner than the external terminal portion and a protruding portion protruding from the thin wall portion to an external connection end face side. In a plan view from a direction where the terminal member and the sensor device overlap, and the sensor device is disposed at a position overlapping the protruding portion and not overlapping the external terminal portion.

According to the sensor unit of this application example, in the plan view, a protruding portion protruding from the thin wall portion to the external connection end face side is provided on the lead portion so as to overlap the sensor device. In the terminal member having such a configuration, a branched columnar member is configured, in which the external terminal portion and the protruding portion correspond to the pin (branch) portion and the thin wall portion corresponds to the column. Since this branched columnar member is buried in the resin, the branched columnar member functions as a so-called branched filler material, and has a deformation suppressing effect against the expansion and shrinkage of the resin due to the change of temperature. Particularly, it is possible to achieve the pinning effect against the so-called resin shrinkage stress, which can suppress movement of the terminal member due to resin shrinkage stress. Owing to this pinning effect, it is possible to reduce the troubles such as the deterioration of the accuracy of measurement performed by the sensor device caused by the concentration of the stress due to the expansion and shrinkage of the resin on the sensor device, and the occurrence of poor connection at the connection portion of the sensor device inside the resin package.

Application Example 2

In the sensor unit according to the application example described above, it is preferable that the protruding portion includes a second external connection end face disposed on a plane same as the external connection end face.

According to this application example, since the external connection end face and the second external connection end face provided on the protruding portion are provided on the same plane, the external connection end face and the second external connection end face can be used for the electrical connection and fixation to the mounting substrate on which the sensor unit is mounted. That is, since mounting on the mounting substrate in one terminal member can be performed at two places such as on the external connection end face and the second external connection end face, even if it is difficult to ensure the quality of the connection state through a visual checking, it is possible to improve the connection strength and the reliability of the electrical connection.

Application Example 3

In the sensor unit according to the application example described above, it is preferable that $0.3 < S2/S1 < 2$, an area of the external connection end face is S1, and an area of the second external connection end face is S2.

According to this application example, the connectable area on the second external connection end face can be secured, and thus, it is possible to reliably perform electrical connection and fixation to the mounting substrate.

Application Example 4

In the sensor unit according to the application example described above, it is preferable that $0.1 < S2/S1 < 1$, the area of the external connection end face is S1, and the area of the second external connection end face is S2.

Since the second external connection end face (the protruding portion) is provided at a position overlapping the sensor device, the interval between the adjacent second external connection end faces becomes small, and thus, a short circuit due to the connection member is likely to occur when connecting to the mounting substrate. According to this application example, by setting the area S2 of the second external connection end face within the range described above, the distance between the adjacent second external connection end faces can be increased, and thus, it is possible to suppress the occurrence of the short circuit due to the connection member when connecting to the mounting substrate.

Application Example 5

In the sensor unit according to the application example described above, it is preferable that $0.8 < H2/H1 < 1$, a thickness of the external terminal portion is H1, and a thickness of a portion including the protruding portion of the lead portion is H2.

According to this application example, by setting the thickness H2 of the portion including the protruding portion of the lead portion to be within the range that is thinner than the thickness H1 of the external terminal portion, the second external connection end face is positioned inside the outer surface of the resin member, and thus, it is possible to suppress the occurrence of the short circuit due to the connection member when connecting to the mounting substrate while maintaining the pinning effect of the protruding portion.

Application Example 6

In the sensor unit according to the application example described above, it is preferable that the protruding portion is covered by an insulation member having electrical insulation properties.

According to this application example, since the protruding portion is covered by an insulation member having electrical insulation properties, it is possible to suppress the occurrence of the short circuit by the connection member between the adjacent protruding portions when connecting to the mounting substrate.

Application Example 7

In the sensor unit according to the application example described above, it is preferable that the protruding portions are provided in plural.

According to this application example, since a plurality of protruding portions are provided, the electrical connection and the fixation to the mounting substrate can be reliably performed, and it is possible to effectively achieve the pinning effect.

Application Example 8

In the sensor unit according to the application example described above, it is preferable that the contour of the resin member has a rectangular shape in the plan view.

According to this application example, since the external terminal portions are disposed along each side of the contour of the rectangular resin member in the plan view, it is possible to efficiently arrange the external terminal portions while sufficiently securing the interval between the external terminal portions, which can prevent the short circuit between the external terminal portions which may occur when connecting to the mounting substrate.

Application Example 9

In the sensor unit according to the application example described above, it is preferable that the sensor unit may further include a second terminal member that is not connected to the sensor device and that the second terminal member may include an extension portion disposed along the contour of the sensor device in the plan view.

According to this application example, in the second terminal member not connected to the sensor device, the extension portions disposed along the contour of the sensor device functions as a shielded line and can block the external electrical noise to the sensor device.

Application Example 10

In the sensor unit according to the application example described above, it is preferable that the sensor unit further includes a second terminal member that is not connected to the sensor device, the contour of the resin member has a rectangular shape in the plan view, the second terminal member includes a pair of external terminal portions disposed along two different sides of the rectangular contour and a second lead portion linking the pair of external terminal portions each other, and the second lead portion includes a thin wall portion having a thickness thinner than the external terminal portion and a second protruding portion protruding from the thin wall portion to the external connection end face side.

According to this application example, by providing the second terminal member that links the portion between the pair of external terminal portions disposed along the two different sides in the rectangular contour using the second lead portion, it is possible to strengthen the strength against the tensile force in the plane direction of the sensor unit.

Application Example 11

In the sensor unit according to the application example described above, it is preferable that the sensor devices are disposed in plural at positions separated from each other in the plan view, and the second lead portion is disposed between the sensor device and another sensor device in the plan view.

According to this application example, by the second lead portion disposed between the sensor device and another sensor device, it is possible to obtain a shielding effect between the sensor device and another sensor device (for example, the sensor device positioned adjacent thereto).

Application Example 12

In the sensor unit according to the application example described above, it is preferable that at least three second terminal members are disposed, and in the plan view, the sensor unit includes a linking portion on a center portion thereof, to which each of the second lead portions of the second terminal members are connected.

According to this application example, since the second lead portions of the plurality of second terminal members are linked to each other at the linking portion positioned on the center portion of the sensor unit, it is possible to prevent the second terminal member from be deformed against the force applied to the two directions along the extending direction of each second terminal member.

Application Example 13

In the sensor unit according to the application example described above, it is preferable that the linking portion includes a placing portion on which the sensor device is placed.

According to this application example, the sensor device can be placed on the placing portion included in the linking portion positioned at the center portion of the sensor unit, and the placed sensor device can be shielded by the placing portion.

Application Example 14

In the sensor unit according to the application example described above, it is preferable that the second protruding portions are provided in plural.

According to this application example, by providing the second protruding portions, it is possible to effectively achieve the pinning effect in the second terminal member (second lead portion).

Application Example 15

In a method of manufacturing a sensor unit according to this application example that includes a plurality of terminal members each of which includes a lead portion and an external terminal portion having an external connection end face side, a sensor device connected to the lead portions of the plurality of terminal members, and a resin member that covers the sensor device and a part of the plurality of terminal members, the lead portion including a thin wall portion having a thickness thinner than the external terminal portion and a protruding portion protruding from the thin wall portion to the external connection end face side, the method includes: forming a thin plate portion including the thin wall portion by performing etching on a lead frame base material provided with a first mask for forming the thin wall portion from an external connection end face side; forming a lead frame including the terminal member provided with the external terminal portion and the protruding portion by providing a second mask for forming the terminal member on the lead frame base material and performing etching after the forming of the thin plate portion; placing the sensor device on the lead frame at a side opposite to a protruding side of the protruding portion by an electrical connection; arranging the resin member so as to cover the sensor device placed on the lead frame and a part of the plurality of terminal members; and cutting the lead frame and the resin member covered by the resin member.

Since the thin wall portion of the lead portion having a thickness thinner than that of the external terminal portion is weak in strength, the mass of the connected sensor device and a shock during handling causes the deformation of the lead portion. Such a deformation of the lead portion is likely to occur as the mass of the sensor device increases, particularly in a case where a plurality of sensor devices are mounted and the sensor units are packaged by resin sealing, it is strongly desired to cope with such a deformation.

On the other hand, according to the method of manufacturing a sensor unit described in this application example, in the terminal member formed as the lead frame by the first etching and the second etching, since the protruding portion protruding from the thin wall portion toward the external connection end face side is provided, the protruding portion functions as a support and can prevent the lead portion from being deformed.

Application Example 16

An inertial measurement device according to this application example includes the sensor unit according to any one of the application examples described above, and a control circuit that controls driving of the sensor unit.

According to the inertial measurement device described in this application example, it is possible to obtain the effect of the sensor unit described above and to obtain a highly reliable inertial measurement device.

Application Example 17

An electronic apparatus according to this application example includes the sensor unit according to any one of the application examples described above, and a control unit that performs control based on a detection signal output from the sensor unit.

According to the electronic apparatus described in this application example, it is possible to obtain the effect of the sensor unit described above and to obtain a highly reliable electronic apparatus.

Application Example 18

A vehicle according to this application example includes the sensor unit according to anyone of the application examples described above, and an attitude control unit that controls an attitude based on a detection signal output from the sensor unit.

According to the vehicle described in this application example, it is possible to obtain the effect of the sensor unit described above and to obtain a highly reliable vehicle.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a sensor unit, a method of manufacturing the sensor unit, an inertial measurement device, an electronic apparatus, and a vehicle according to the invention will be described in detail based on embodiments illustrated in the accompanying drawings. The embodiments described below do not unduly limit the content of the invention described in the aspect of the invention. In addition, all of the configurations described in the present embodiment are not necessarily essential components of the invention.

In each of the drawings referred to below, there are three axes of X axis, Y axis and Z axis which are orthogonal to each other, and a plane on which an external terminal portion of a terminal member is disposed is defined as X axis and Y axis, and a direction in which the terminal member and the sensor device are connected to each other is defined as Z axis. In addition, a direction parallel to X axis is referred to as an "X axis direction", a direction parallel to Y axis is referred to as a "Y axis direction", and a direction parallel to Z axis is referred to as a "Z axis direction". In addition, an arrow end side of each axis is referred to as a "plus side", the plus side of the Z axis direction is referred to as a "front or front side", the opposite side thereof is referred to as a "minus side", and the minus side of the Z axis direction is referred to as "back or back side".

Sensor Unit

First Embodiment

Figure 1:
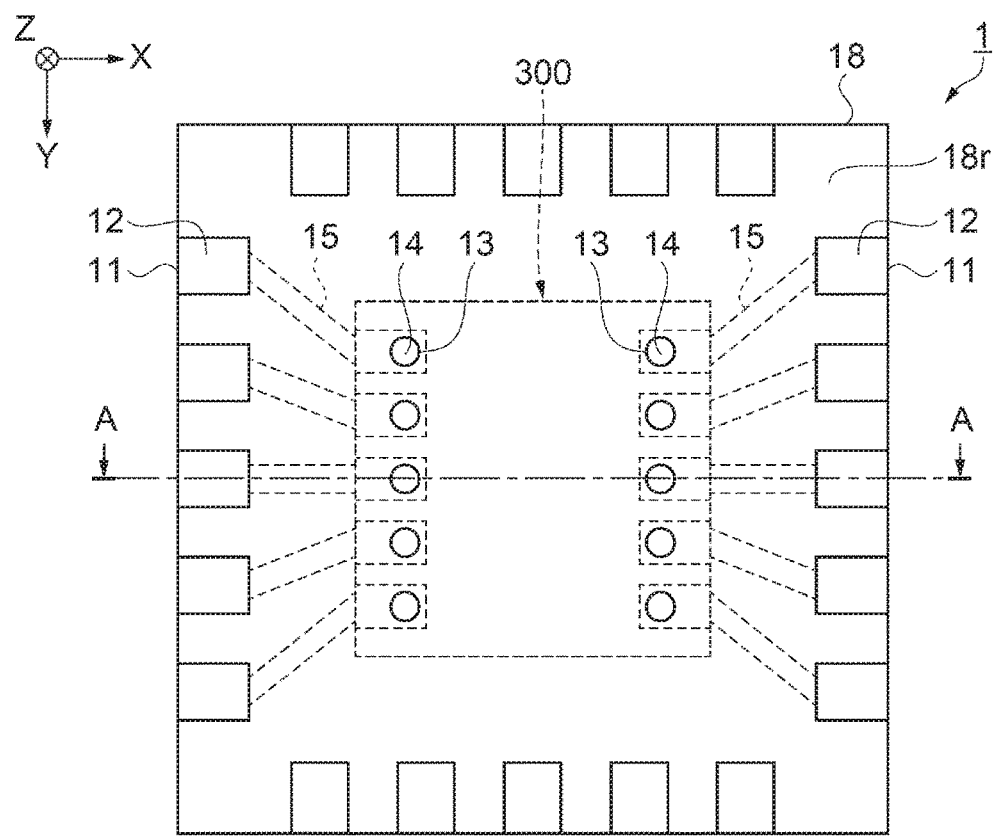
FIG. 1 is a plan view schematically illustrating a sensor unit in a first embodiment.
Figure 2:
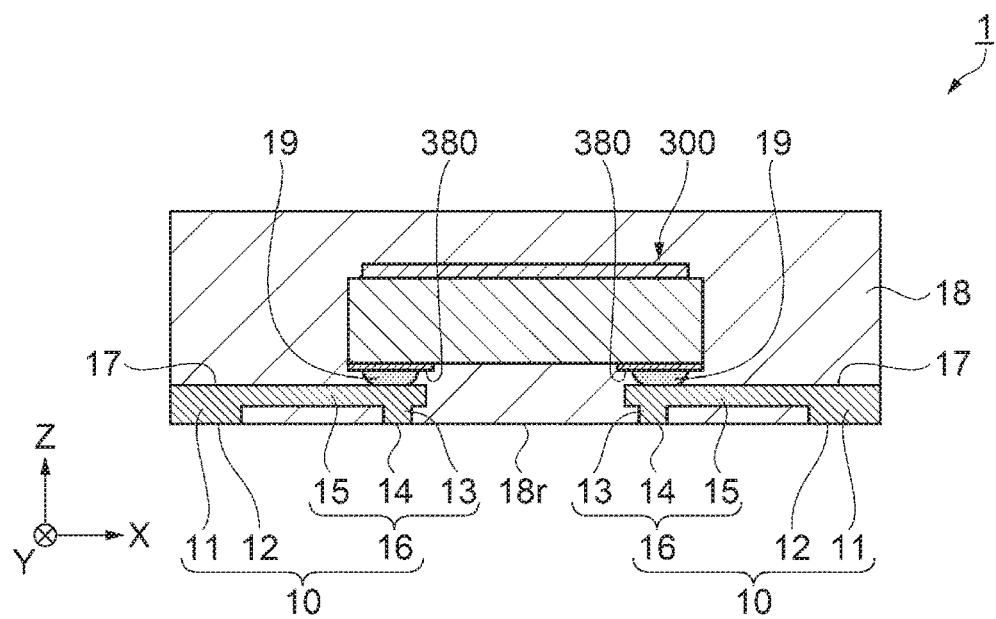
FIG. 2 is a sectional view taken along the line A-A in FIG. 1.
Figure 3:
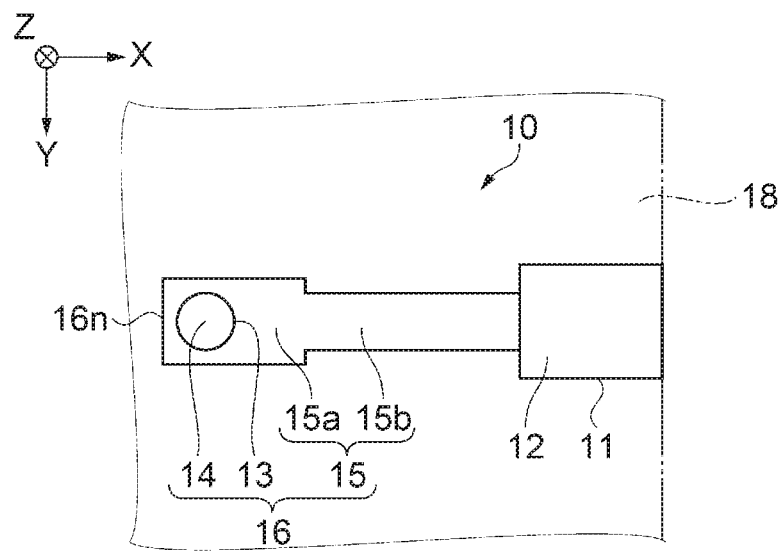
FIG. 3 is a plan view schematically illustrating a terminal member of the sensor unit in the first embodiment.
Figure 4:
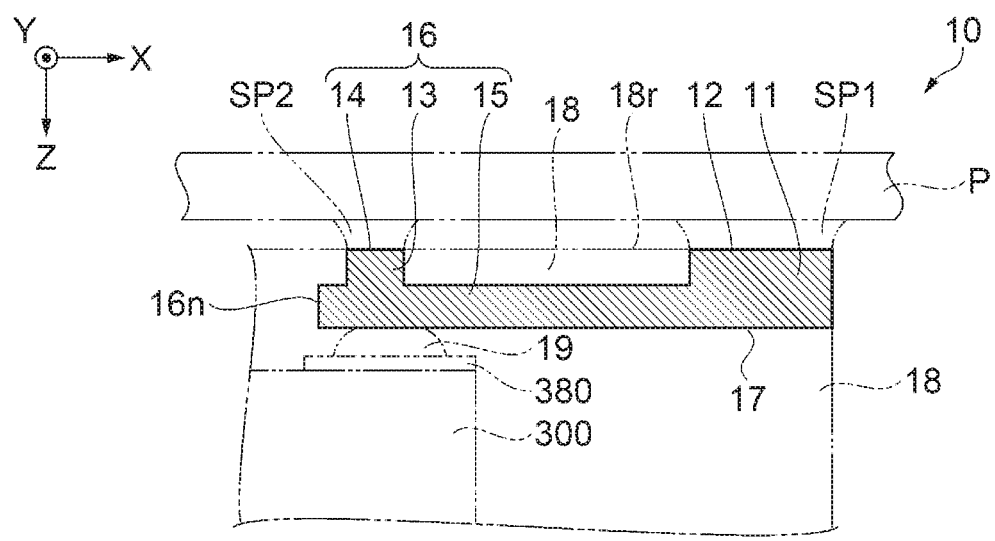
FIG. 4 is a sectional view schematically illustrating the terminal member.
Figure 5:
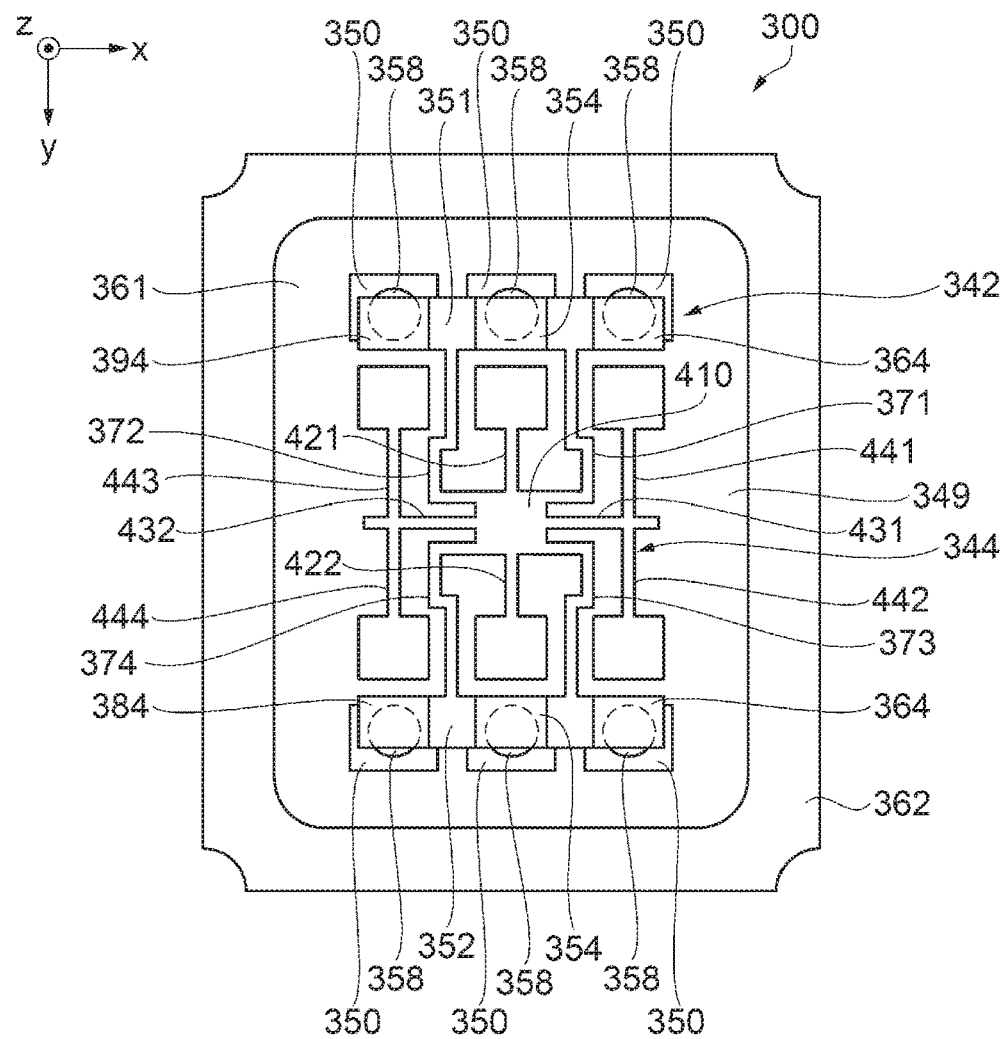
FIG. 5 is a plan view illustrating a schematic configuration of a Gyro device as a sensor device.
Figure 6:
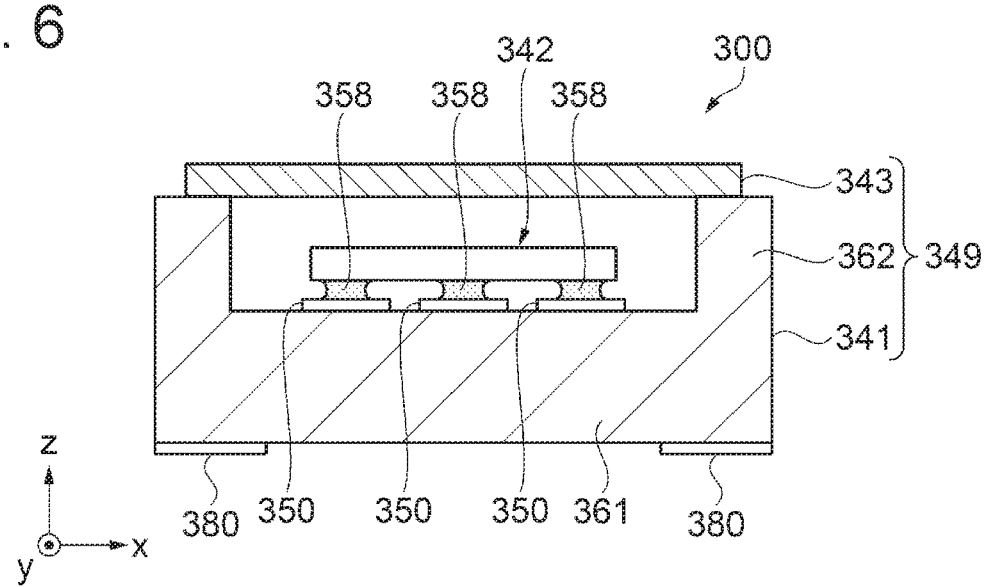
FIG. 6 is a sectional view illustrating a schematic configuration of the gyro device.

First, a sensor unit in a first embodiment will be described with reference to FIG. 1 to FIG. 6. FIG. 1 is a plan view schematically illustrating the sensor unit in the first embodiment. FIG. 2 is a sectional view schematically illustrating the sensor unit taken along the line A-A in FIG. 1. FIG. 3 is a plan view schematically illustrating a terminal member of the sensor unit in the first embodiment. FIG. 4 is a sectional view schematically illustrating the terminal member. FIG. 5 is a plan view illustrating a schematic configuration of a Gyro device as a sensor device. FIG. 6 is a sectional view illustrating a schematic configuration of the gyro device.

A sensor unit 1 illustrated in FIG. 1 and FIG. 2 is an angular velocity sensor that can measure an angular velocity ωz around the Z axis. The sensor unit 1 includes a plurality of terminal members 10, a Gyro device 300 as a sensor device, and a resin member 18 as an insulation member covering the Gyro device 300 and at least a part of the plurality of terminal members 10. In the sensor unit 1, in a plan view from the Z axis direction, the shape of a contour of the resin member 18 is formed as rectangular, that is, configured to be a rectangular external shape.

As illustrated in FIG. 1, a plurality of terminal members 10 are lead terminals extending from the center portion to the outer circumferential portion of the sensor unit 1. Hereinafter, "a plurality of terminal members 10" will be described as "terminal member 10". The terminal members 10 are disposed in a predetermined pattern with a certain interval between each other. The terminal member 10 has a lead portion 16 including a portion to which the Gyro device 300 is connected and an external terminal portion 11 that is continuous to the lead portion 16 and includes an external connection end face 12.

Although not illustrated, the terminal member 10 can be formed by etching a metal thin plate such as a copper plate, a copper alloy, an iron nickel alloy plate, or punching out the metal thin plate using a metal mold. In addition, the terminal member 10 is formed as a lead frame integrally linked by a tie bar, a support frame, or the like (not illustrated), and is separated from the tie bar and the support frame at the time of individualization after sealing with the resin member 18 (resin molding), and then, formed as individual terminals.

The external terminal portions 11 are disposed along the contour (outer edge) of the resin member 18 having a rectangular plan view shape in a plan view from the Z axis direction, that is, along the outer edge of the sensor unit 1 and are disposed with an interval from each other. The external terminal portion 11 has the external connection end face 12 that is exposed from a back surface 18r which is a back side surface of the resin member 18. The external terminal portion 11 functions as a terminal electrode, in which the external connection end face 12 and a connection electrode (not illustrated) of a mounting substrate P (refer to FIG. 4) for connecting and fixing the sensor unit 1 are fixed by the electrical connection using a connection member SP1 (refer to FIG. 4) such as solder.

In the sensor unit 1 in the first embodiment, as illustrated in FIG. 2, the external terminal portions 11 are configured to be disposed along each of the four sides constituting the contour (outer edge) of the sensor unit 1, but not limited thereto, and the external terminal portions 11 may be configured to be disposed along two opposing sides, and the external terminal portions 11 may not be configured to be disposed on the other two sides.

The lead portion 16 includes a thin wall portion 15 which is positioned on the center portion side of the sensor unit 1, continuous to the external terminal portion 11 and has a thickness thinner than that of the external terminal portion 11, and further includes a protruding portion 13 that protrudes from the thin wall portion 15 to the external connection end face 12 side (the minus side of the Z axis in the drawing which is the back surface side of the sensor unit 1). The thin wall portion 15 includes a wide portion 15a having an inner end 16n which is an end portion positioned opposite to the external terminal portion 11 and a narrow portion 15b connecting the wide portion 15a and the external terminal portion 11. Each external terminal 380 of the corresponding Gyro device 300 is fixed to a front surface 17 which is a side opposite to the external connection end face 12 of the plurality of lead portions 16 by the electrical connection using a joining member 19 such as a conductive adhesive. Here, the external terminals 380 of the Gyro device 300 correspond to a plurality of connection terminals of the sensor device. The thin wall portion 15 is not limited to be configured to include the wide portion 15a and the narrow portion 15b, but may have a configuration in which the width is constant, or changes sequentially or stepwise.

The protruding portion 13 is disposed in the wide portion 15a on the inner end 16n side of the lead portion 16 on the opposite side of the external terminal portion 11, and for example, is provided at a position overlapping the connected Gyro device 300 in a plan view from the Z axis direction. The protruding portion 13 includes a second external connection end face 14 disposed on the plane same as the external connection end face 12, as an end face opposite to the thin wall portion 15.

By providing those protruding portions 13 and the external terminal portions 11, a plurality of lead portions 16 with the branched columnar member are configured, in each of which the protruding portion 13 and the external terminal portion 11 correspond to a pin (branch) portion and the thin wall portion 15 corresponds to the column portion, and then, are buried in the resin member 18. The lead portion 16 configured as a branched columnar member buried in the resin member 18 functions as a so-called branched filler material and has a deformation suppressing effect against the expansion and shrinkage of the resin due to the change of the temperature. Particularly, it is possible to achieve the pinning effect against the so-called resin shrinkage stress, which can suppress the movement of the lead portion 16 (terminal member 10) due to resin shrinkage stress.

In addition, similarly to the external connection end face 12 of the external terminal portion 11, the second external connection end face 14 of the protruding portion 13 can function as the terminal electrode that is fixed to the mounting substrate P (refer to FIG. 4) by the electrical connection using a connection member SP2 (refer to FIG. 4) such as the solder. That is, the mounting on the mounting substrate P can be performed at two places such as on the external connection end face 12 (the connection member SP1) and on the second external connection end face 14 (the connection member SP2) for one terminal member 10, and thus, it is possible to improve the connection strength and the reliability of the electrical connection.

In addition, it is preferable that the protruding portion 13 is configured such that a ratio of an area of the second external connection end face 14 to an area of the external connection end face 12 provided on the external terminal portion 11 is set as follows. Specifically, when the area of the external connection end face 12 provided on the external terminal portion 11 is assumed to be S1, and the area of the second external connection end face 14 provided on the protruding portion 13 is assumed to be S2, it is preferable that the protruding portion 13 is configured such that the area S1 of the external connection end face 12 and the area S2 of the second external connection end face 14 provided in the protruding portion 13 satisfy the relationship of $0.3<S2/S1<2$.

By configuring the protruding portion 13 as described above, it is possible to secure a sufficient area for using the second external connection end face 14 for the external connection, and thus, it is possible to perform the electrical connection and fixing to the mounting substrate P (refer to FIG. 4). Therefore, the connection of the sensor unit 1 to the mounting substrate P can be performed at two places (a plurality of places) of the external terminal portion 11 and the protruding portion 13, and thus, the connection can be more accurate and highly reliable.

The sensor unit 1 (the resin member 18) has a rectangular external shape in a plan view from the Z axis direction. In other words, in a plan view from the Z axis direction, the resin member 18 has four sides on the contour that is the outer circumferential edge. In this way, by forming the contour of the resin member 18 as rectangle in a plan view and by arranging the external terminal portions 11 along each side forming the contour of the resin member 18, it is possible to efficiently arrange the external terminal portions 11 while sufficiently securing an interval such that a short circuit between each external terminal portion 11 (the external connection end face 12) can be prevented, which may occur when connecting to the mounting substrate P.

The resin member 18 as an insulation member having electrical insulation can accommodate the terminal members 10, the Gyro device 300, and the like in a cavity of a resin mold (not illustrated), and can perform resin molding by applying resin molding methods such as a transfer method or a compression method.

The Gyro device 300 as the sensor device is disposed at a position overlapping the protruding portions 13 and at a position not overlapping the external terminal portions 11, and is connected to the terminal members 10. The Gyro device 300 is a sensor device capable of measuring the angular velocity ωz around the Z axis. Hereinafter, a configuration example of the Gyro device 300 will be described with reference to FIG. 5 and FIG. 6. FIG. 5 is a plan view illustrating a schematic configuration of the Gyro device as a sensor device. FIG. 6 is a sectional view illustrating a schematic configuration of the Gyro device. For convenience of description, a lid (lid body) is omitted in FIG. 5. In addition, in FIG. 5 and FIG. 6, three mutually orthogonal axes are the x axis, the y axis and the Z axis, and the Z axis coincides with a thickness direction of the vibrator device. In addition, the direction parallel to the x-axis is referred to as the "x axis direction", the direction parallel to the y axis is referred to as the "y axis direction", and the direction parallel to the z-axis is referred to as the "z axis direction".

As illustrated in FIG. 5 and FIG. 6, the Gyro device 300 includes a Gyro element 342 and a package 349 that accommodates the Gyro element 342. Hereinafter, the Gyro element 342 and the package 349 will be sequentially described in detail.

In FIG. 5, the Gyro element 342 viewed from the upper side (the lid 343 side) is illustrated. The Gyro element 342 is provided with a detection signal electrode, a detection signal wiring, a detection signal terminal, a detection ground electrode, a detection ground wiring, a detection ground terminal, a drive signal electrode, a drive signal wiring, a drive signal terminal, a drive ground electrode, a drive ground terminal and the like, but they are not illustrated in the drawing.

The Gyro element 342 is an "out-of-plane detection type" sensor for measuring the angular velocity around the z axis, and is configured to include a base material, a plurality of electrodes, wirings and terminals provided on the surface of the base material, none of which are illustrated. The Gyro element 342 can be configured with a piezoelectric material such as quartz crystal, lithium tantalite or lithium niobate, and among them, it is preferable to be configured with the quartz crystal. In this way, the Gyro element 342 that can show excellent vibration characteristics (frequency characteristics) can be obtained.

The Gyro element 342 includes a so-called double T-shaped vibrating body 344, a first support portion 351 and a second support portion 352 as support portions for supporting the vibrating body 344, a first connecting beam 371 and a second connecting beam 372 that link the vibrating body 344 and the first support portion 351, and a third connecting beam 373 and a fourth connecting beam 374 that link the vibrating body 344 and the second support portion 352.

The vibrating body 344 spreads in the xy plane and has a thickness in the z axis direction. The vibrating body 344 includes a base portion 410 positioned at the center, a first detection vibrating arm 421 and a second detection vibrating arm 422 extending to both sides along the y axis direction from the base portion 410, a first linking arm 431 and a second linking arm 432 extending to both sides along the x axis direction from the base portion 410, a first drive vibrating arm 441 and a third drive vibrating arm 442 extending to both sides along the y axis direction from the tip end portion of the first linking arm 431, and a second drive vibrating arm 443 and a fourth drive vibrating arm 444 extending to both sides along the y axis direction from the tip end portion of the second linking arm 432.

The first drive vibrating arm 441 and the third drive vibrating arm 442 may extend from the middle of the extending direction of the first linking arm 431, and similarly, the second drive vibrating arm 443 and the fourth drive vibrating arm 444 may extend from the middle of the extending direction of the second linking arm 432. In addition, in the present embodiment, the configuration in which the first linking arm 431 extends from the base portion 410, and the first drive vibrating arm 441, the third drive vibrating arm 442, the second drive vibrating arm 443, and the fourth drive vibrating arm 444 extend from the second linking arm 432 is described, however, the base portion 410, the first linking arm 431 and the second linking arm 432 may be collectively set as the base portion. That is, a configuration in which the first drive vibrating arm, the second drive vibrating arm, the third drive vibrating arm, and the fourth drive vibrating arm extend from the base portion, is also possible.

The Gyro element 342 measures the angular velocity co around the z axis as follows. When an electric field is generated between the drive signal electrode (not illustrated) and the drive ground electrode (not illustrated) in a state where the angular velocity ω is not applied, each drive vibrating arm 441, 443, 442, 444 of the Gyro element 342 performs flexural vibration in the x axis direction. When the angular velocity is applied to the Gyro element 342 around the z axis in a state where the drive vibration is performed, the vibration in they axis direction occurs. That is, the Coriolis force in the y axis direction acts on the drive vibrating arms 441, 443, 442, and 444 and the linking arms 431 and 432, in response to this vibration, the detection vibrations in the x-axis direction of the detection vibrating arms 421 are 422 are excited. The distortion of the detection vibrating arms 421 and 422 generated by this vibration can be detected by the detection signal electrode (not illustrated) and the detection ground electrode (not illustrated), and then, the angular velocity can be obtained.

The package 349 accommodates the Gyro element 342. In addition to the Gyro element 342, an IC chip or the like for driving the Gyro element 342 or the like may be accommodated in the package 349. Such a package 349 has a substantially rectangular shape in a plan view (xy plan view).

The package 349 includes a base 341 having a recess open to the upper surface and the lid (lid body) 343 joined to the base so as to close the opening of the recess. In addition, the base 341 includes a plate shaped bottom plate 361 and a frame shaped side wall 362 provided on the upper circumferential edge portion of the bottom plate 361. Such a package 349 has an accommodation space inside thereof, and the Gyro element 342 is accommodated and installed in the accommodation space in an airtight manner.

The Gyro element 342 is fixed to the upper surface of the bottom plate 361 on the first support portion 351 and the second support portion 352 via a conductive fixing member 358 such as solder or a conductive adhesive (an adhesive in which a conductive filler such as metal particles of silver is dispersed in a resin material). Since the first support portion 351 and the second support portion 352 are positioned at both end portions in the y axis direction of the Gyro element 342, by fixing such a portion to the bottom plate 361, the vibrating body 344 of the Gyro element 342 is supported by both sides, and thus, the Gyro element 342 can be stably fixed to the bottom plate 361.

In addition, six conductive fixing members 358 are provided separated from each other, in correspondence with (in contact with) two detection signal terminals 364, two detection ground terminals 354, a drive signal terminal 384, and a drive ground terminal 394 that are provided in the first support portion 351 and the second support portion 352. In addition, six connection pads 350 are provided on the upper surface of the bottom plate 361, in correspondence with two detection signal terminals 364, two detection ground terminals 354, the drive signal terminal 384, and the drive ground terminal 394, and each connection pad 350 and any one of the corresponding terminals are electrically connected to each other via the conductive fixing member 358. In addition, the connection pad 350 is electrically connected to the external terminal 380 as a plurality of connection terminals via an internal wiring, a through electrode, and the like, none of which are illustrated.

According to the Gyro element 342 having a configuration described above, it is possible to efficiently measure the required angular velocity of one axis direction with high accuracy.

According to the sensor unit 1 in the first embodiment described above, in a plan view from the Z axis direction, the protruding portion 13 that is protruding from the thin wall portion 15 to the external connection end face 12 side (minus Z axis direction) is provided on the lead portion 16 configuring the terminal member 10 so as to overlap the Gyro device 300 as a sensor device. In the terminal member 10 having such a configuration, the lead portion 16 with the branched columnar member, in which the external terminal portion 11 and the protruding portion 13 correspond to a pin (branch) portion and the thin wall portion 15 corresponds to the column portion, is configured and buried in the resin member 18. Therefore, the lead portion 16 functions as a so-called branched filler material and has a deformation suppressing effect against the expansion and shrinkage of the resin due to the change of temperature. Particularly, the lead portion 16 having such a configuration can suppress the movement of the terminal member 10 due to the resin shrinkage stress, that is, can achieve a so-called pinning effect against the resin shrinkage stress. Owing to this pinning effect, it is possible to reduce the troubles such as the deterioration of the accuracy of measurement performed by the Gyro device 300 caused by the concentration of the stress due to the expansion and shrinkage of the resin member 18 on the embedded Gyro device 300, and the occurrence of poor connection at the connection portion (the joining member 19) between the Gyro device 300 inside the resin package (resin member 18) and the terminal member 10.

In addition, similarly to the external connection end face 12, it is possible to cause the second external connection end face 14 of the protruding portion 13 to function as the terminal electrode that is fixed to the mounting substrate P (refer to FIG. 4) by the electrical connection using the connection member SP2 (refer to FIG. 4) such as the solder. That is, the mounting connection on the mounting substrate P can be performed at two places such as on the external connection end face 12 (the connection member SP 1) and on the second external connection end face 14 (the connection member SP2) for one terminal member 10. If the external terminal portion 11 is disposed in an area (on the back surface 18r side of the resin member 18) inside the outer edge portion (end portion along contour) of the sensor unit 1 formed by the resin member 18, there is a problem in that it is difficult to ensure the quality of the connection state at the time of connection to the substrate (soldering, or the like). On the contrary, by performing the mounting connection at two positions in one terminal member 10 as described above, the connection strength and the reliability of the electrical connection can be improved, and thus, even if it is difficult to ensure the quality through a visual check of the connection state, it is possible to improve the connection strength and the reliability of the electrical connection.

By configuring the protruding portion 13 such that the area S2 of the second external connection end face 14 and the area S1 of the external connection end face 12 provided in the external terminal portion 11 satisfy the relationship of $0.1<S2/S1<1$, following effects can be obtained. Since the second external connection end face 14 of the protruding portion 13 is provided at a position overlapping the Gyro device 300, the interval between the adjacent second external connection end faces 14 becomes small, and thus, a short circuit due to the connection member SP2 is likely to occur when connecting to the mounting substrate P (refer to FIG. 4). On the contrary, by setting the area S2 of the second external connection end face 14 within the range described above, the interval between the adjacent second external connection end faces 14 can be increased, and thus, it is possible to suppress the occurrence of the short circuit due to the connection member SP2 when connecting to the mounting substrate P.

Second Embodiment

Figure 7:
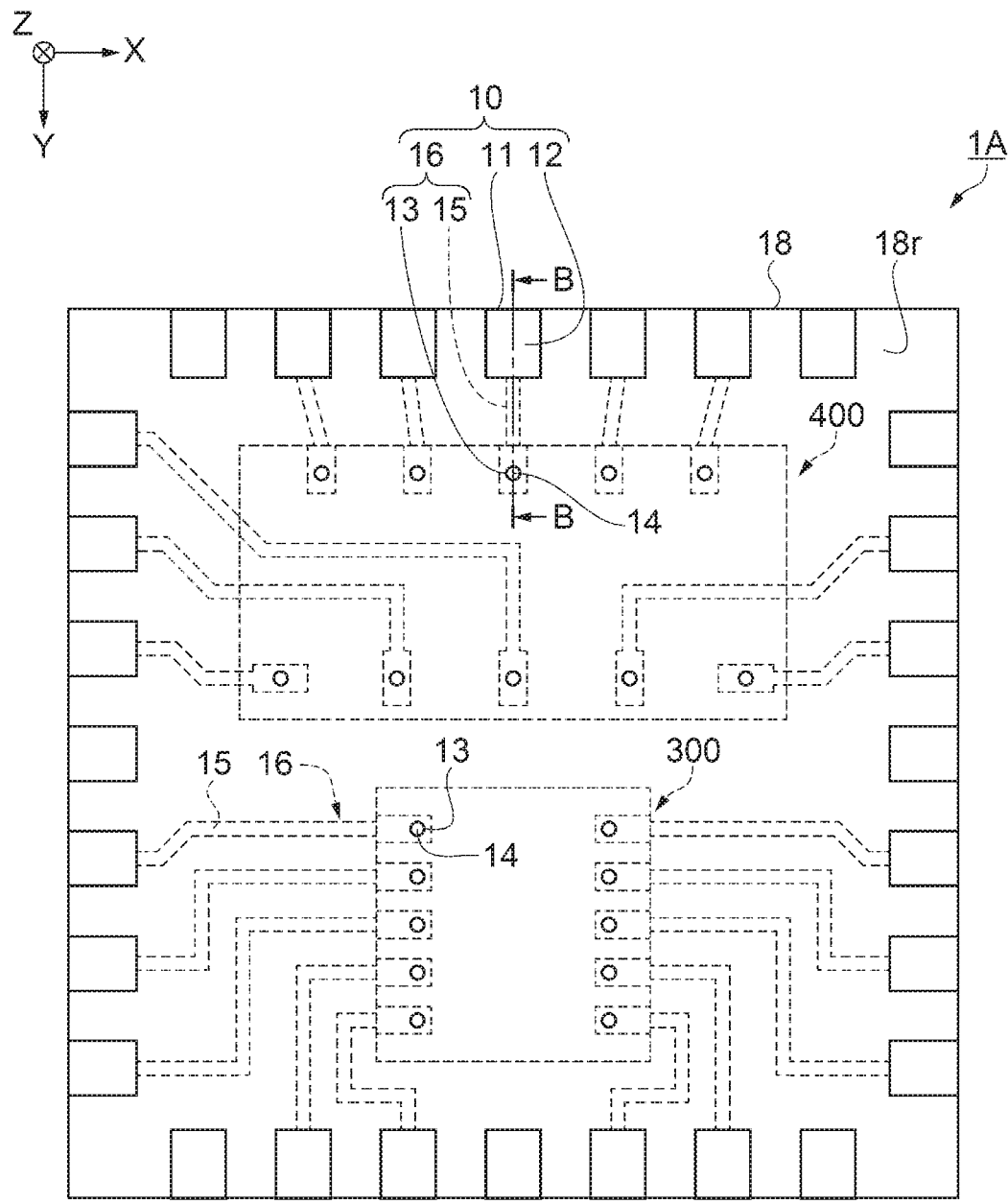
FIG. 7 is a plan view schematically illustrating a sensor unit in a second embodiment.
Figure 8:
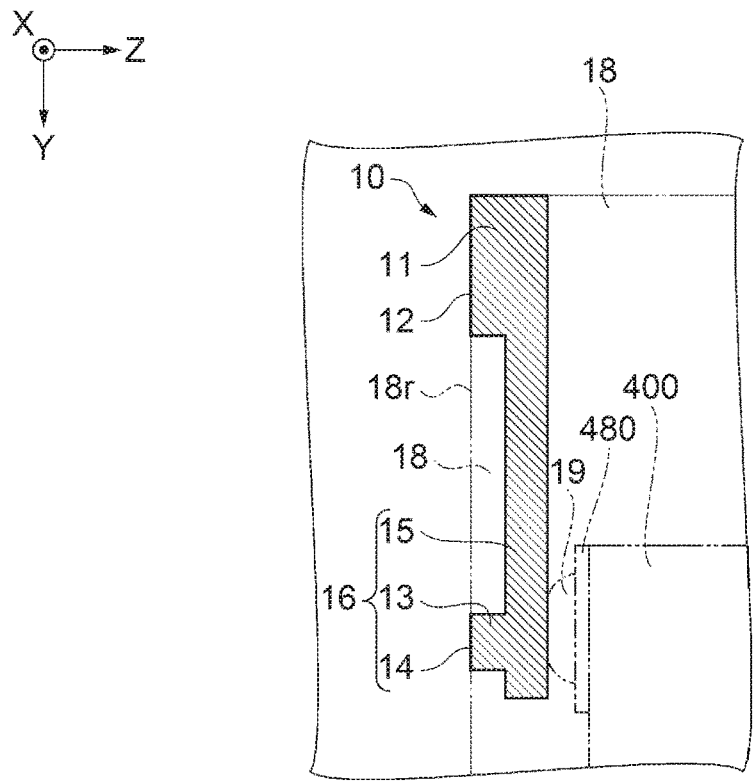
FIG. 8 is a sectional view taken along the line B-B in FIG. 7.

Next, a sensor unit in a second embodiment will be described with reference to FIG. 7 and FIG. 8. FIG. 7 is a plan view schematically illustrating the sensor unit in the second embodiment. FIG. 8 is a sectional view taken along the line B-B in FIG. 7. In the description below, the description will be focused on the differences from the first embodiment described above, and the same reference numerals will be given to similar items, and description thereof will be omitted.

As illustrated in FIG. 7 and FIG. 8, a sensor unit 1A in the second embodiment is a composite sensor that can measure the angular velocity around the Z axis and the accelerations in the X axis direction, the Y axis direction, and the Z axis direction. The sensor unit 1A includes a plurality of terminal members 10, a Gyro device 300 as a sensor device connected to the terminal member 10, an acceleration sensor device 400 as another sensor device similarly connected to the terminal member 10, and a resin member 18 covering the Gyro device 300, the acceleration sensor device 400, and apart of the plurality of terminal members 10. The sensor unit 1A is configured to have a rectangular external shape in a plan view from the Z axis direction.

The terminal member 10 is a lead terminal extending from the center portion to the outer circumferential portion of the sensor unit 1A. The terminal members 10 are disposed with a certain interval between each other. A plurality of terminal members 10 each have a lead portion 16 including a portion to which the Gyro device 300 is connected and an external terminal portion 11 that is continuous to the lead portion 16 and includes an external connection end face 12. The lead portion 16 includes a thin wall portion 15 which is positioned on the center portion side of the sensor unit 1A, continuous to the external terminal portion 11 positioned at the outer circumferential side of the sensor unit 1A and has a thickness thinner than that of the external terminal portion 11, and further includes a protruding portion 13 that protrudes from the thin wall portion 15 to the external connection end face 12 side (the minus side of the Z axis in the drawing which is the back surface side of the sensor unit 1A). The configuration of the terminal member 10 is the same as that in the first embodiment described above except that the patterning (creeping shape) of the lead portion 16 is different, and the detailed description thereof will be omitted.

The Gyro device 300 can measure the angular velocity ωz around the Z axis as in the first embodiment. In the Gyro device 300, the corresponding external terminal 380 is fixed by the electrical connection to the front surface 17 of the lead portion 16 using the joining member 19 such as a conductive adhesive.

The acceleration sensor device 400 is a three axis acceleration sensor device that can independently measure the acceleration in the X axis direction, the Y axis direction, and the Z axis direction. Similarly to the Gyro device 300, in the acceleration sensor device 400, the front surface 17 of the lead portion 16 and the external terminal 480 of the corresponding acceleration sensor device 400 are fixed to each other by the electrical connection using the joining member 19 such as a conductive adhesive (refer to FIG. 8). The Gyro device 300 and the acceleration sensor device 400 fixed to the front surface 17 of the lead portion 16 are disposed in parallel in the Y axis direction as illustrated in FIG. 7.

In the sensor unit 1A in the second embodiment, similarly to the first embodiment, with the configuration of the connected terminal member 10 (the lead portion 16) to which the Gyro device 300 and the acceleration sensor device 400 are connected, the protruding portion 13 that is protruding from the thin wall portion 15 to the external connection end face 12 side is provided so as to overlap the Gyro device 300 or the acceleration sensor device 400 as the sensor devices. Similarly to the first embodiment, the terminal member 10 having such a configuration can suppress the movement of the terminal member 10 due to the resin shrinkage stress, that is, can achieve a so-called pinning effect against the resin shrinkage stress. Owing to this pinning effect, it is possible to reduce the troubles such as the deterioration of the accuracy of measurement performed by the Gyro device 300 and the acceleration sensor device 400 caused by the concentration of the stress due to the expansion and shrinkage of the resin member 18 on the embedded Gyro device 300 and the acceleration sensor device 400, and the occurrence of poor connection at the connection portion (the joining member 19) between the Gyro device 300 and the acceleration sensor device 400 inside the resin package (resin member 18) and the terminal member 10.

Third Embodiment

Figure 9:
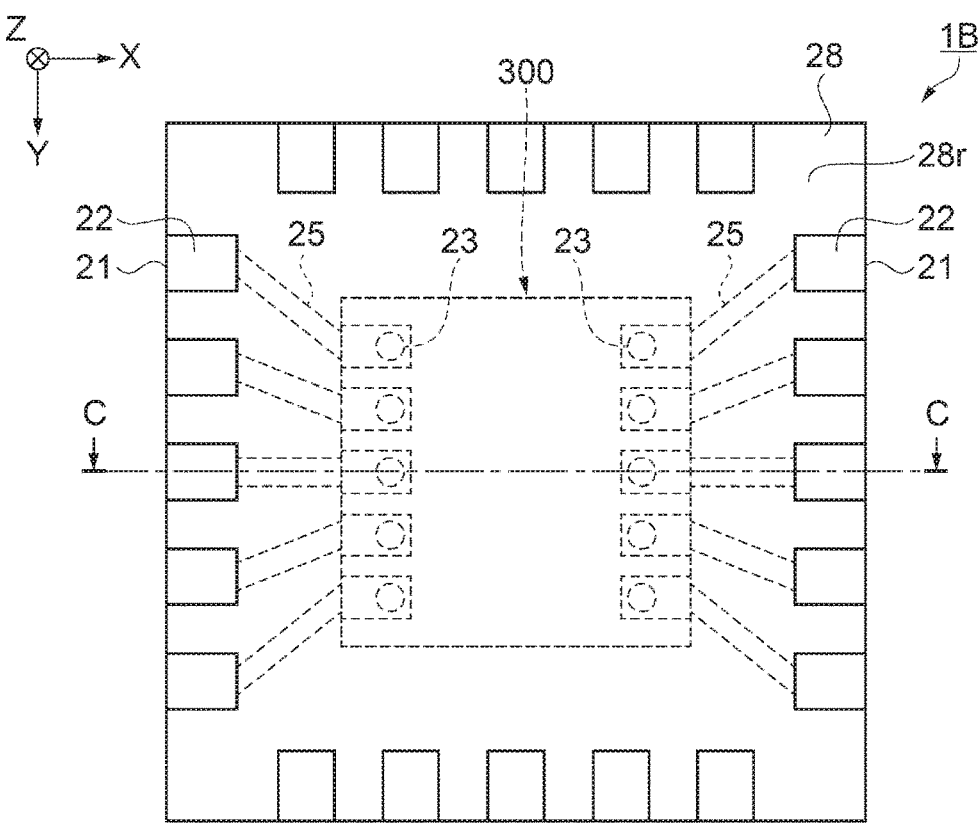
FIG. 9 is a plan view schematically illustrating a sensor unit in a third embodiment.
Figure 10:
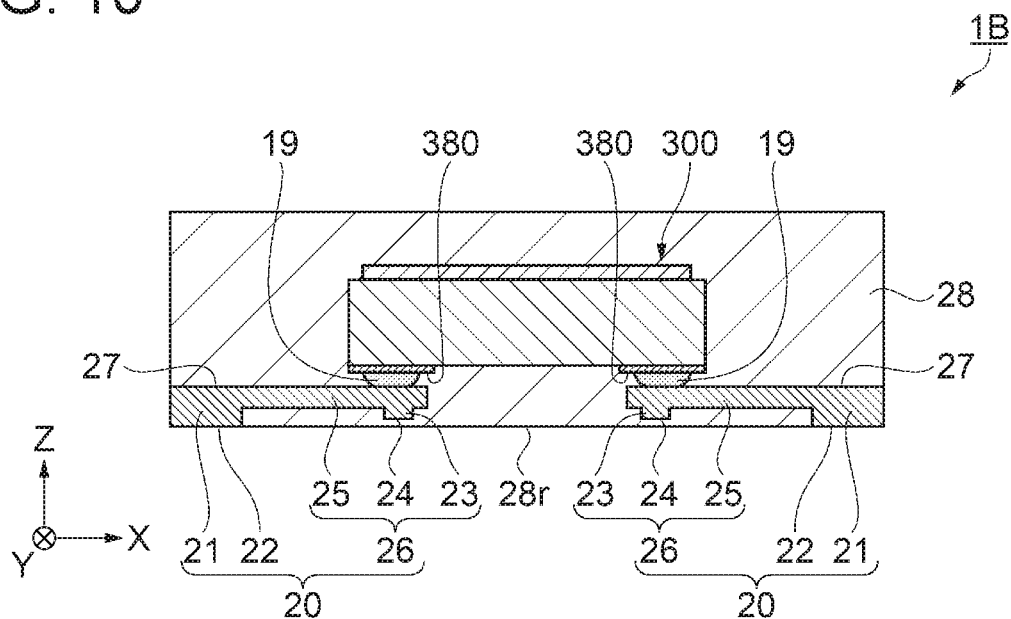
FIG. 10 is a sectional view taken along the line C-C in FIG. 9.
Figure 11:
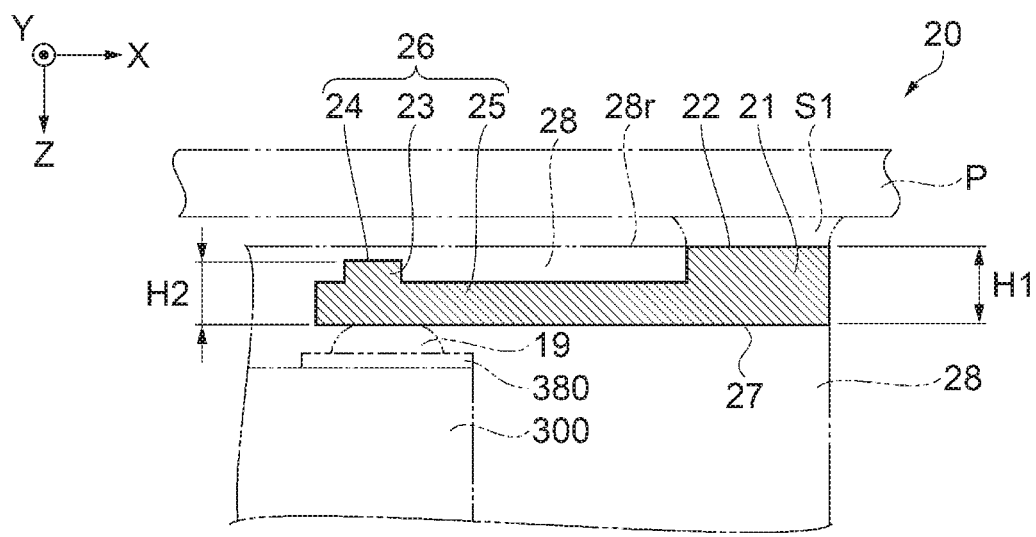
FIG. 11 is a sectional view schematically illustrating a terminal member of the sensor unit in the third embodiment.

Next, a sensor unit in a third embodiment will be described with reference to FIG. 9, FIG. 10 and FIG. 11. FIG. 9 is a plan view schematically illustrating a sensor unit in the third embodiment. FIG. 10 is a sectional view taken along the line C-C in FIG. 9. FIG. 11 is a cross-sectional view schematically illustrating a terminal member of the sensor unit in the third embodiment.

A sensor unit 1B in the third embodiment illustrated in FIG. 9, FIG. 10 and FIG. 11 is similar to that in the first embodiment except that the configuration of the lead portion 26 configuring the terminal member 20 is different. In the description below, the description will be focused on the terminal member 20 that is a difference point from the first embodiment described above, and the same reference numerals will be given to similar items, and description thereof will be omitted.

As illustrated in FIG. 9, FIG. 10 and FIG. 11, the sensor unit 1B in the third embodiment is an angular velocity sensor unit that can measure the angular velocity ωz around the Z axis. The sensor unit 1B includes a plurality of terminal members 20, a Gyro device 300 as a sensor device, and a resin member 28 covering the Gyro device 300 and a part of the plurality of terminal members 20. The sensor unit 1B is configured to have a rectangular external shape in a plan view from the Z axis direction.

The terminal member 20 is a lead terminal extending from the center portion to the outer circumferential portion of the sensor unit 1B. The terminal members 20 are disposed with a certain interval between each other. A plurality of terminal members 20 each have a lead portion 26 including a portion to which the Gyro device 300 is connected and an external terminal portion 21 that is continuous to the lead portion 26 and includes an external connection end face 22. The lead portion 26 includes a thin wall portion 25 which is positioned on the center portion side of the sensor unit 1B, continuous to the external terminal portion 21 and has a thickness thinner than that of the external terminal portion 21, and further includes a protruding portion 23 that protrudes from the thin wall portion 25 to the external connection end face 22 side (the minus side of the Z axis in the drawing which is the back surface side of the sensor unit 1B).

The terminal member 20 can be formed by etching a metal thin plate such as a copper plate, a copper alloy, an iron nickel alloy plate, or punching out the metal thin plate using a metal mold. In addition, the terminal member 20 is formed as a lead frame integrally linked by a tie bar, a support frame, or the like (not illustrated), and is separated from the tie bar and the support frame at the time of individualization after sealing with the resin member 28 (resin molding), and then, formed as individual terminals.

In the terminal member 20 in the third embodiment, the configuration of the protruding portion 23 is different from that in the first embodiment. The configurations of the external terminal portion 21 and the thin wall portion 25 are similar to those of the external terminal portion 11 and the thin wall portion 15 in the first embodiment, and the description thereof will be omitted and the description will be focused on the protruding portion 23 having the different configuration.

The protruding portion 23 is disposed in the thin wall portion 25 of the lead portion 26 opposite side of the external terminal portion 21, and is provided at a position overlapping the connected Gyro device 300 in a plan view from the Z axis direction. The protruding portion 23 includes an end face 24 positioned on the side opposite to the thin wall portion 25 side.

As illustrated in FIG. 11, the end face 24 is provided along an imaginary plane closer to the side where the Gyro device 300 is disposed than an imaginary plane on which the external connection end face 22 is provided. In other words, as illustrated in FIG. 11, assuming that the thickness of the external terminal portion 21 is H1 and the thickness of the portion including the protruding portion 23 of the lead portion 26 is H2, it is preferable that the end face of the protruding portion 23 is provided at a position satisfying the relationship of $0.8<H2/H1<1$. Here, the thickness H1 of the external terminal portion 21 is a distance from the surface 27 of the lead portion 26 on the Gyro device 300 side to the external connection end face 22, and similarly, the thickness H2 of the protruding portion 23 is a distance from the surface 27 of the lead portion 26 to the end face 24.

As described above, by setting the thickness H2 of the portion including the protruding portion 23 of the lead portion 26 to be within the above range which is smaller than the thickness H1 of the external terminal portion 21, the end face 24 becomes to be positioned slightly inside the back surface 28r of the resin member 28. Therefore, the end face 24 is covered by the resin member 28 as an insulation member having an electrical insulation and is not exposed to the back surface 28r of the resin member 28.

In the region overlapping the Gyro device 300 where the end face 24 is positioned, the interval between adjacent protruding portions 23 becomes narrow. However, according to the configuration of the terminal member 20 of the sensor unit 1B in the third embodiment described above, it is possible to suppress the short circuit between adjacent protruding portions 23 (the end face 24) due to the connection member when connecting to the mounting substrate P while maintaining the pinning effect of the protruding portion 23.

In the example described above, the end face 24 is covered by the resin member 28 as the insulation member, but instead of the resin member 28, for example, it is possible to suppress the occurrence of the short circuit between adjacent protruding portions 23 (end faces 24) by applying nonconductive resin to the end face 24 or by attaching a masking member such as a nonconductive tape thereto, similarly to the resin member 28.

Fourth Embodiment

Figure 12:
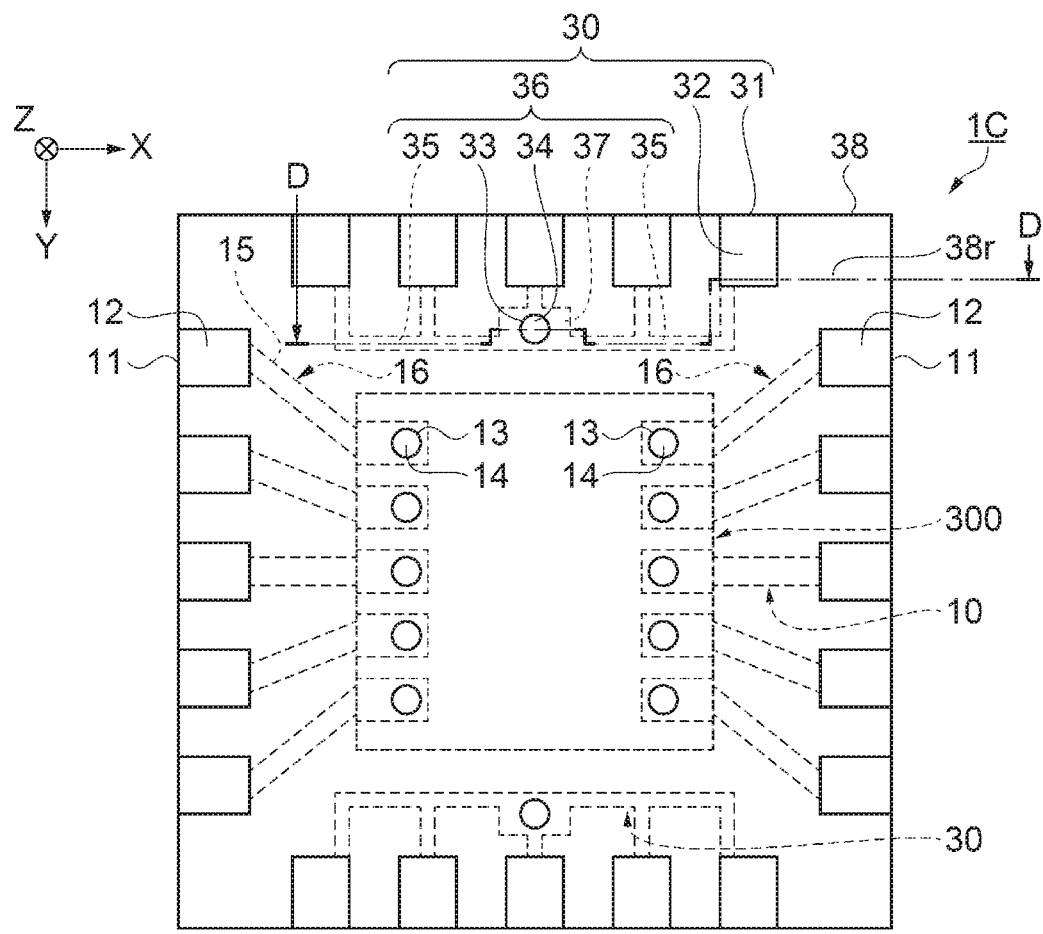
FIG. 12 is a plan view schematically illustrating a sensor unit in a fourth embodiment.
Figure 13:
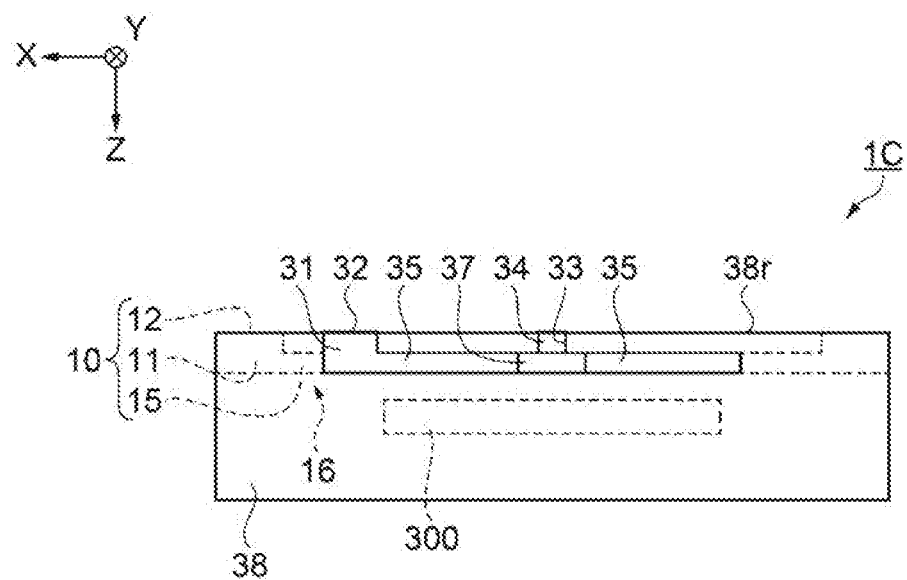
FIG. 13 is a sectional view taken along the line D-D in FIG. 12.

Next, a sensor unit in a fourth embodiment will be described with reference to FIG. 12 and FIG. 13. FIG. 12 is a plan view schematically illustrating the sensor unit in the fourth embodiment. FIG. 13 is a sectional view taken along the line D-D in FIG. 12.

A sensor unit 1C in the fourth embodiment illustrated in FIG. 12 and FIG. 13 includes a terminal member 10 including a lead portion 16 similar to that in the first embodiment connected to the Gyro device 300, and a second terminal member 30 including a second lead portion 36 as an extension portion that is not connected to the Gyro device 300. Other configurations of sensor unit 1C are the same as that in the first embodiment. The description below will be focused on the second terminal member 30 which is the difference point from the above-described first embodiment, and the same reference signs will be given to the similar items, and the description thereof will be omitted.

The sensor unit 1C in the fourth embodiment is an angular velocity sensor that can measure the angular velocity ωz around the Z axis similarly to the first embodiment. The sensor unit 1C includes a plurality of the terminal members 10, a plurality of the second terminal members 30, the Gyro device 300 as a sensor device, and a resin member 38 covering the Gyro device 300 and part of the terminal members 10 and the second terminal members 30. The sensor unit 1C is configured to have a rectangular external shape in a plan view from the Z axis direction.

A plurality of terminal members 10 are lead terminals extending from the center portion of the sensor unit 1C to the outer circumferential portion as in the first embodiment. A plurality of terminal members 10 are disposed with a certain interval from each other. A plurality of terminal members 10 each have a lead portion 16 including a portion to which the Gyro device 300 is connected and an external terminal portion 11 that is continuous to the lead portion 16 and includes an external connection end face 12.

The external terminal portions 11 are disposed along the contour (outer edge) of the resin member 38 having the rectangular plan view shape in a plan view from the z axis direction, that is, along the outer edge of the sensor unit 1 with an interval from each other. The external terminal portions 11 in the present embodiment are disposed along two outer edges facing each other along the Y axis direction. The external terminal portion 11 includes the external connection end face 12 exposed from the back surface 38r which is the back side surface of the resin member 38. The configuration of the external terminal portion 11 is the same as that in the first embodiment, and a detailed description thereof will be omitted.

The lead portion 16 includes a thin wall portion 15 which is positioned on the center portion side of the sensor unit 1, continuous to the external terminal portion 11 and has a thickness thinner than that of the external terminal portion 11, and further includes a protruding portion 13 that protrudes from the thin wall portion 15 to the external connection end face 12 side (the minus side of the Z axis in the drawing which is the back surface side of the sensor unit 1). The configuration of the lead portion 16 including the thin wall portion 15 and the protruding portion 13 is similar to that in the first embodiment, and a detailed description thereof will be omitted.

The second terminal member 30 is a lead terminal that is not connected to the Gyro device 300. The second terminal members 30 in the present embodiment are provided in pair, one each in the direction (Y axis direction) where the terminal member 10 connected to the Gyro device 300 is not provided. The second terminal member 30 includes the second lead portion 36 as an extension portion disposed along the contour of the Gyro device 300 in a plan view from the Z axis direction with an interval from the Gyro device 300, and a second external terminal portion 31 that is continuous to the second lead portion 36 and includes an external connection end face 32. The second terminal member 30 is not limited to be disposed as the pair as in the present embodiment, but may be configured to be disposed as one, or equal to or more than three.

Similarly to the terminal member 10, the second terminal member 30 can be formed by etching a metal thin plate such as a copper plate, a copper alloy, an iron nickel alloy plate, or punching out the metal thin plate using a metal mold. In addition, the second terminal member 30 is formed as a lead frame integrally linked with the terminal member 10 by a tie bar, a support frame, or the like (not illustrated), and is separated from the tie bar and the support frame at the time of individualization after sealing with the resin member 38 (resin molding), and then, formed as individual terminals.

The second external terminal portions 31 are disposed along the contour (outer edge) of the resin member 38 having a rectangular plan view shape in a plan view from the z axis direction, that is, along the outer edge of the sensor unit 1C and are disposed with an interval from each other. The second external terminal portions 31 are disposed along the outer edge of the sensor unit 1C where the external terminal portions 11 are not disposed, in the present embodiment, along the two outer edges facing each other in the X axis direction. The second external terminal portion 31 includes an external connection end face 32 exposed from the back surface 38r which is the back side surface of the resin member 38. The second external terminal portion 31 can function as a terminal electrode that connects the external connection end face 32 and the connection electrode of a mounting substrate (not illustrated) for connecting and fixing the sensor unit 1C.

The second lead portion 36 is continuous to the second external terminal portion 31 and is disposed along the contour of the Gyro device 300 in a plan view from the Z axis direction with a certain interval from the Gyro device 300. The second lead portion 36 includes a thin wall portion 35 having a thickness thinner than that of the second external terminal portion 31 and a second protruding portion 33 that protrudes from the thin wall portion 35 to the external connection end face 32 side (the minus side of the Z axis in the drawing which is the back surface side of the sensor unit 1). A wide portion 37 is provided on a middle portion of the thin wall portion 35. The thin wall portion 35 is not limited to be configured to include the wide portion 37, but may be a configuration of a constant width or a configuration in which the width sequentially changes or gradually changes.

As described above, in the second terminal member 30 that is not connected to the Gyro device 300, the second lead portion 36 disposed along the contour of the Gyro device 300 functions as a shielded wire, and thus, the electrical noise to the Gyro device 300 from the outside can be shielded.

The second protruding portion 33 is disposed in the wide portion 37 provided in the middle of the thin wall portion 35. The second protruding portion 33 includes an external connection end face 34 disposed on the plane same as the external connection end face 32 of the second external terminal portion 31, as the end face opposite to the thin wall portion 35. Similarly to the external connection end face 32, the external connection end face 34 of the second protruding portion 33 can function as a terminal electrode for the connection to the mounting substrate (not illustrated).

By providing the second protruding portion 33 and the second external terminal portion 31 as described above, the second lead portion 36 of a branched columnar member in which the second protruding portion 33 and the second external terminal portion 31 correspond to the pin (branch) portion and the thin wall portion 35 corresponds to the column portion, is configured and buried in the resin member 38. The second lead portion 36 configured as a branched columnar member buried in the resin member 38 functions as a so-called branched filler material and has a deformation suppressing effect against the expansion and contraction of the resin due to the change of temperature. Particularly, it is possible to achieve the pinning effect against the so-called resin shrinkage stress, which can suppress the movement of the second lead portion 36 (the second terminal member 30) due to resin shrinkage stress.

In addition, it is preferable that the second protruding portion 33 is configured such that a ratio of an area of the external connection end face 34 to an external connection end face 32 of the second external terminal portion 31 is set as follows. Specifically, when the area of the external connection end face 32 of the second external terminal portion 31 is assumed to be S1, and the area of the external connection end face 34 of the second protruding portion 33 is assumed to be S2, it is preferable that the second protruding portion 33 is configured such that the area S1 of the external connection end face 32 and the area S2 of the external connection end face 34 satisfy the relationship of 0.3<S2/S1<2. With the configuration described above, it is possible to secure a sufficient area for using the second external connection end face 34 for the external connection. Therefore, the connection of the sensor unit 1C to the mounting substrate (not illustrated) can be performed at a plurality of places of the second external terminal portion 31 and the second protruding portion 33, and thus, the connection can be more accurate and highly reliable.

As described above, according to the sensor unit 1C in the fourth embodiment, in addition to the terminal member 10 connected to the Gyro device 300, the second terminal member 30 not connected to the Gyro device 300 is provided along the contour of the Gyro device 300. The second lead portion 36 of the second terminal member 30 disposed along the contour of the Gyro device 300 functions as a shielded line, and thus, the electrical noise to the Gyro device 300 from the outside can be shielded. In addition to the effect of the terminal member 10, similarly to the first embodiment, by providing the second protruding portion 33 and the second external terminal portion 31, the second lead portion 36 configured as a branched columnar member buried in the resin member 38 functions as a so-called branched filler material and has a deformation suppressing effect against the expansion and contraction of the resin due to change of temperature. Particularly, it is possible to achieve the pinning effect against the so-called resin shrinkage stress, which can suppress the movement of the second lead portion 36 (the second terminal member 30) due to resin shrinkage stress.

Fifth Embodiment

Figure 14:
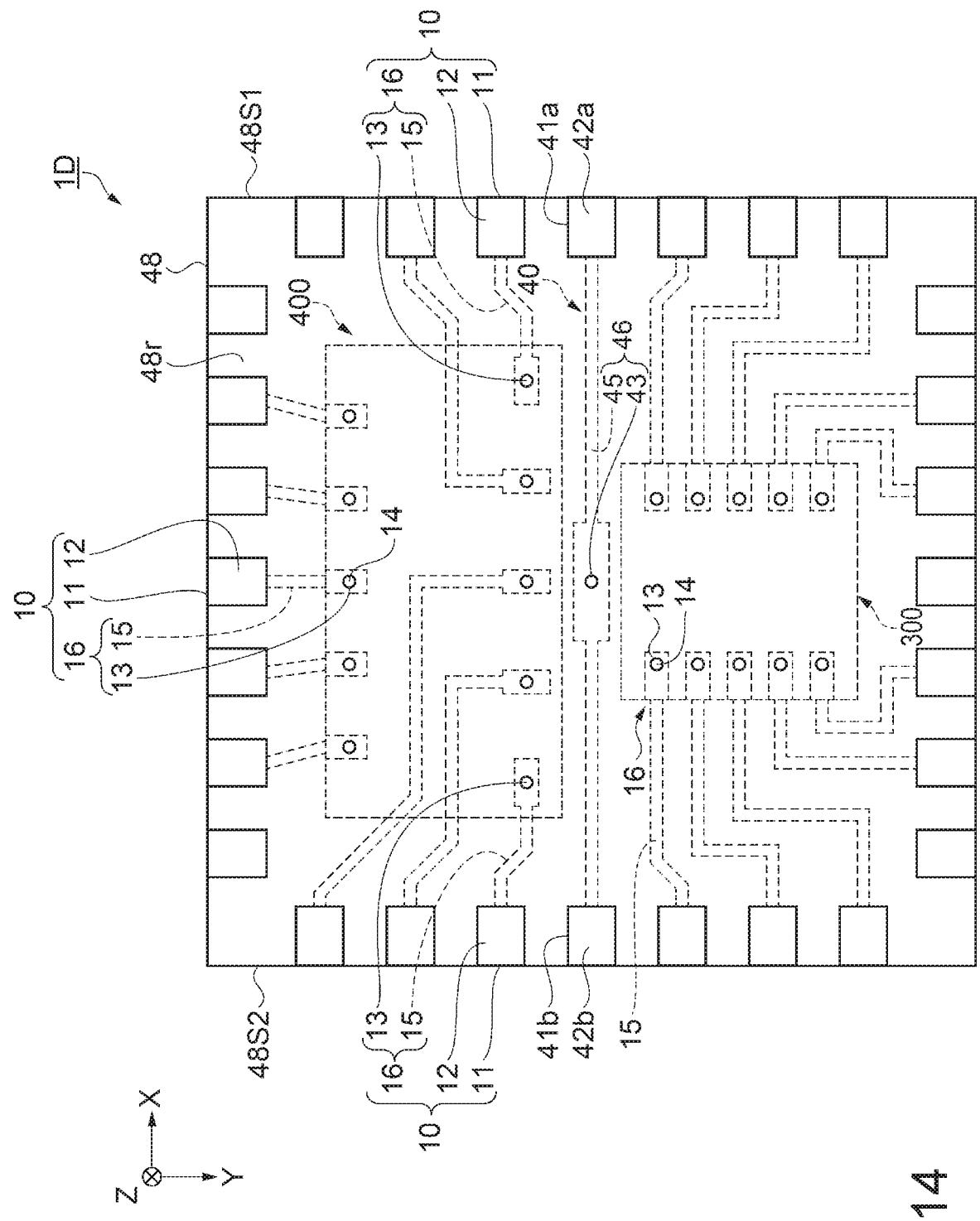
FIG. 14 is a plan view schematically illustrating a sensor unit in a fifth embodiment.

Next, a sensor unit in a fifth embodiment will be described with reference to FIG. 14. FIG. 14 is a plan view schematically illustrating the sensor unit in the fifth embodiment. A sensor unit 1D in the fifth embodiment illustrated in FIG. 14 is conjured to be provided with a second terminal member 40 in the sensor unit in the second embodiment described above, and the other configuration is the same as that in the second embodiment. The description below will be focused on the difference point from the above-described second embodiment, and the same reference signs will be given to the similar items, and the description thereof will be omitted.

As illustrated in FIG. 14, the sensor unit 1D in the fifth embodiment is a composite sensor that can measure the angular velocity around the Z axis and the accelerations in the X axis direction, the Y axis direction, and the Z axis direction. The sensor unit 1D described above includes a plurality of terminal members 10 and the second terminal members 40, the Gyro device 300 as a sensor device and an acceleration sensor device 400 as another sensor device connected to the terminal member 10, and a resin member 48 that covers the Gyro device 300, the acceleration sensor device 400, and a part of the plurality of terminal members 10 and the second terminal member 40. The sensor unit 1D is configured to have a rectangular external shape in a plan view from the Z axis direction. The Gyro device 300 and the acceleration sensor device 400 are disposed at positions separated from each other in a plan view.

The sensor unit 1D includes a terminal member 10 including a lead portion 16 similar to that in the second embodiment connected to the Gyro device 300 and the acceleration sensor device 400, and a second terminal member 40 including a second lead portion 46 as an extension portion that is not connected to the Gyro device 300 or the acceleration sensor device 400. Other configurations of sensor unit 1D are the same as that in the second embodiment. The description below will be focused on the second terminal member 40 which is the difference point from that in the second embodiment described above, and the same reference numerals will be given to the plurality of terminal members 10, the Gyro device 300, and the acceleration sensor device 400 having the same configuration and the description thereof will be omitted. In addition, since the configuration of the resin member 48 is similar to that in the second embodiment, and the description thereof will be omitted.

A plurality of terminal members 10 are lead terminals connected to the Gyro device 300 and the acceleration sensor device 400. In contrast, the second terminal member 40 is a lead terminal that is not connected to the Gyro device 300 or the acceleration sensor device 400.

The second terminal member 40 includes a pair of external terminal portions 41a and 41b respectively disposed along the two different sides 48S1 and 48S2 in a rectangular contour (contour of the resin member 48) of the sensor unit 1D, and a second lead portion 46 that links a pair of external terminal portion 41a and external terminal portion 41b. The two different sides 48S1 and 48S2 of the rectangular contour of the sensor unit 1D in the present embodiment are two sides facing each other side along the Y axis. In addition, a pair of external terminal portions 41a and 41b are provided to replace each one of the center portions of the plurality of external terminal portions 11 configuring the terminal member 10 disposed along the two sides 48S1 and 48S2 with the external terminal portions 41a and 41b. In addition, the second terminal member 40 is not limited to be disposed in one as in the present embodiment, and a plurality of second terminal members 40 may be disposed.

The second lead portion 46 continuous to the external terminal portion 41a and the external terminal portion 41b extends between the Gyro device 300 and the acceleration sensor device 400 in a plan view from the Z axis direction. In other words, the second lead portion 46 extends between the Gyro device 300 and the acceleration sensor device 400 from the external terminal portion 41a on one side 48S1 side and is continuous to the external terminal portion 41b on the other side 48S2 side. In this way, by arranging the second lead portion 46 between the Gyro device 300 and the acceleration sensor device 400, it is possible to obtain a shielding effect between the Gyro device 300 and the adjacent acceleration sensor device 400.

The second lead portion 46 as an extension portion includes a thin wall portion 45 having a thickness thinner than that of the external terminal portions 41a and 41b, and a second protruding portion 43 that protrudes from the thin wall portion 45 toward the external connection end faces 42a and 42b. The second protruding portion 43 is provided on the center portion between the external terminal portion 41a and the external terminal portion 41b.

Similarly to the terminal member 10, the second terminal member 40 can be formed by etching a metal thin plate such as a copper plate, a copper alloy, an iron nickel alloy plate, or punching out the metal thin plate using a metal mold. The second terminal member 40 is formed as a lead frame including the terminal member 10 integrally linked by a tie bar, a support frame or the like (not illustrated), and is separated at the time of individualization after sealing with the resin member 48, and then, formed as individual terminals.

The external terminal portion 41a and 41b are disposed along the contour (outer edge) of the resin member 48 having a rectangular plan view shape in a plan view from the Z axis direction, that is, along the outer edge of the sensor unit 1D and are disposed with an interval from each other. The external terminal portions 41a and 41b respectively include the external connection end faces 42a and 42b exposed from the back surface 48r which is the back side surface of the resin member 48. The external terminal portions 41a and 41b functions as terminal electrodes that connect the external connection end face 42a and 42b with a connection electrode of the mounting substrate (not illustrated) connecting and fixing the sensor unit 1D.

According to the sensor unit 1D in the fifth embodiment described above, by providing the second terminal member 40 that links the portions between a pair of external terminal portion 41a and the external terminal portion 41b disposed along the two different sides 48S1 and 48S2 in the rectangular contour of the resin member 48, using the second lead portion 46, it is possible to strengthen the strength against the tensile force in the plane direction of the sensor unit 1D.

Sixth Embodiment

Figure 15:
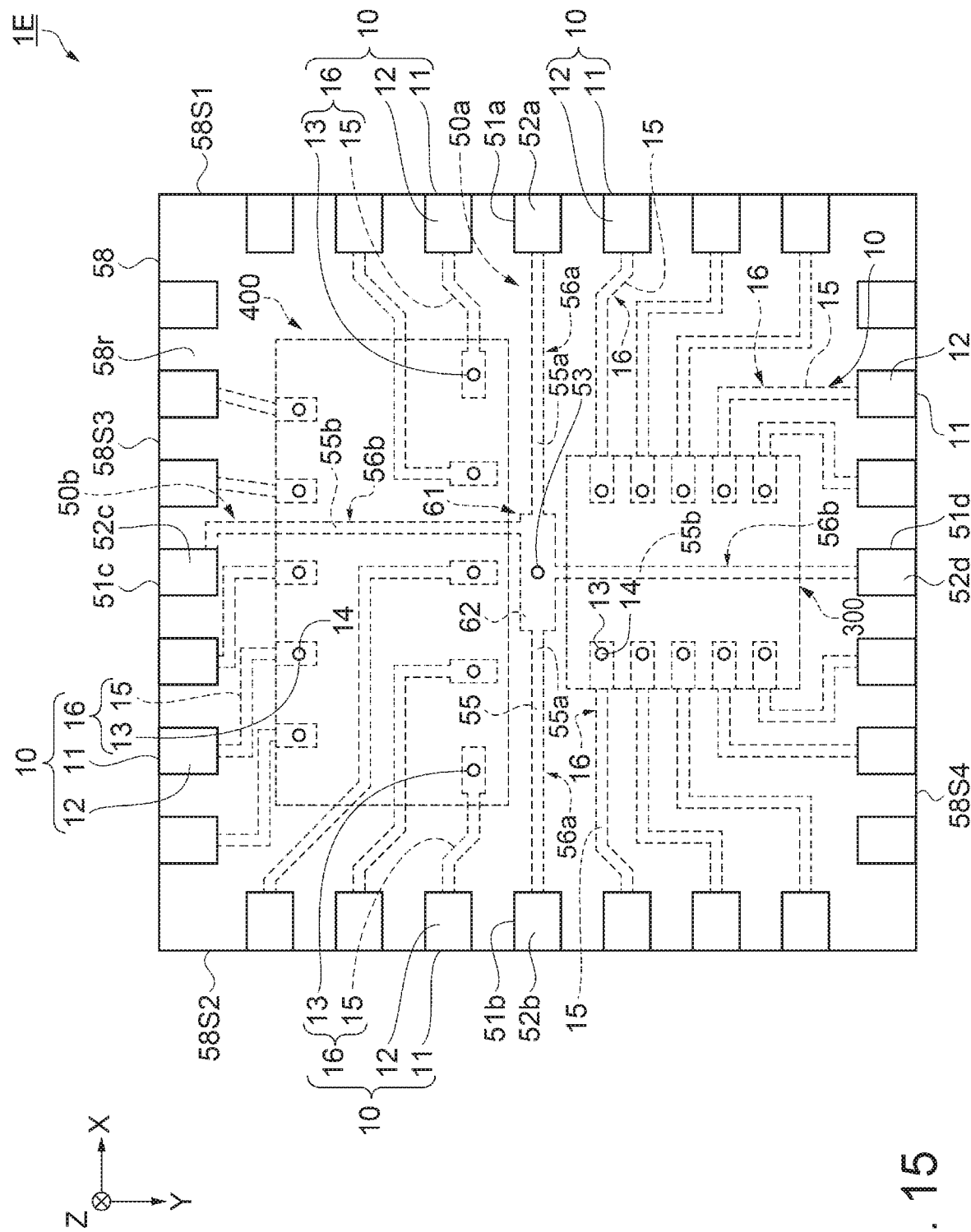
FIG. 15 is a plan view schematically illustrating a sensor unit in a sixth embodiment.

Next, a sensor unit in a sixth embodiment will be described with reference to FIG. 15. FIG. 15 is a plan view schematically illustrating the sensor unit in the sixth embodiment. A sensor unit 1E in the sixth embodiment illustrated in FIG. 15 is configured to have a shape different from that of the second terminal member 40 in the fifth embodiment described above, and the other configuration is the same as that in the fifth embodiment. The description below will be focused on the difference point from the above-described fifth embodiment, and the same reference signs will be given to the similar items, and the description thereof will be omitted.

As illustrated in FIG. 15, the sensor unit 1E in the sixth embodiment is a composite sensor that can measure the angular velocity around the Z axis and the accelerations in the X axis direction, the Y axis direction, and the Z axis direction. The sensor unit 1E described above includes a plurality of terminal members 10, second terminal members 50a and 50b, the Gyro device 300 as a sensor device connected to the terminal member 10, an acceleration sensor device 400 as a sensor device similarly connected to the terminal member 10, and a resin member 58 that covers the Gyro device 300, the acceleration sensor device 400, and a part of the plurality of terminal members 10 and the second terminal members 50a, 50b. The sensor unit 1E is configured to have a rectangular external shape in a plan view from the Z axis direction.

The sensor unit 1E includes a terminal member 10 including a lead portion 16 similar to that in the fifth embodiment connected to the Gyro device 300 and the acceleration sensor device 400, and a second terminal member including second lead portions 56a and 56b as an extension portion that is not connected to the Gyro device 300 or the acceleration sensor device 400. It is desirable that at least three second terminal members are provided. In the sensor unit 1E, other configurations are the same as that in the fifth embodiment. The description below will be focused on the second terminal members 50a and 50b which are the difference point from that in the fifth embodiment described above, and the same reference numerals will be given to the plurality of terminal members 10, the Gyro device 300, and the acceleration sensor device 400 having the same configuration and the description thereof will be omitted. In addition, since the configuration of the resin member 58 is similar to that in the fifth embodiment, and the description thereof will be omitted.

A plurality of terminal members 10 are lead terminals connected to the Gyro device 300 and the acceleration sensor device 400. In contrast, the two second terminal members 50a and 50b are lead terminals that are not connected to the Gyro device 300 or the acceleration sensor device 400.

One second terminal member 50a includes a pair of external terminal portions 51a and 51b respectively disposed along the two different sides 58S1 and 58S2 in a rectangular contour (contour of the resin member 58) of the sensor unit 1E, and a second lead portion 56a that links a pair of external terminal portion 51a and external terminal portion 51b. Two sides 58S1 and 58S2 are two sides facing each other along the Y axis. In addition, a pair of external terminal portions 51a and 51b are provided to replace each one of the center portions of the plurality of external terminal portions 11 configuring the terminal member 10 disposed along the two sides 58S1 and 58S2 with the external terminal portions 51a and 51b.

The other second terminal member 50b includes a pair of external terminal portions 51c and 51d respectively disposed along the two different sides 58S3 and 58S4 facing the above-described two sides 58S1 and 58S2 in a crossing manner in the rectangular contour (contour of the resin member 58) of the sensor unit 1E, and a second lead portion 56b that links a pair of external terminal portion 51c and external terminal portion 51d. The two sides 58S3 and 58S4 are two sides facing each other along the X axis. In addition, a pair of external terminal portions 51c and 51d are provided to replace each one of the center portions of the plurality of external terminal portions 11 configuring the terminal member 10 disposed along the two sides 58S3 and 58S4 with the external terminal portions 51c and 51d.

The second lead portion 56a as an extension portion continuous to the external terminal portion 51a and the external terminal portion 51b configuring one second terminal member 50a extends between the Gyro device 300 and the acceleration sensor device 400 in a plan view from the Z axis direction. In other words, the second lead portion 56a extends between the Gyro device 300 and the acceleration sensor device 400 from the external terminal portion 51a on one side 58S1 side and is continuous to the external terminal portion 51b on the other side 58S2 side.

The second lead portion 56b as an extension portion continuous to the external terminal portion 51c and the external terminal portion 51d configuring the other second terminal member 50b is provided at a position where the Gyro device 300 and the acceleration sensor device 400 overlaps each other in a plan view from the Z axis direction. In other words, the second lead portion 56b extends through the back surface 58r side of the acceleration sensor device 400 from the external terminal portion 51c on one side 58S3 side, and is linked to the second lead portion 56a at the linking portion 61 in a crossing manner. In addition, the second lead portion 56b extends through the back surface 58r side of the Gyro device 300 from the second lead portion 56a and is continuous to the external terminal portion 51d on the other side 58S4 side.

As described above, in the plurality (two in the present embodiment) of second terminal members 50a and 50b, the second lead portions 56a and 56b of the second terminal members 50a and 50b are linked to each other in a crossing manner at the linking portion 61 disposed in the center portion of the sensor unit 1E in a plan view from the Z axis direction.

The second lead portion 56a configuring one second terminal member 50a includes a thin wall portion 55a having a thickness thinner than the external terminal portions 51a and 51b, a wide portion 62 which is positioned at the center portion of the thin wall portion 55a (the center portion of the sensor unit 1E) and is wider than the thin wall portion 55a, and a second protruding portion 53 protruding from the wide portion 62 to the external connection end faces 52a and 52b side. The second protruding portion 53 is provided within the wide portion 62 in a plan view from the Z axis direction and on the center portion between the external terminal portion 51a and the external terminal portion 51b. The wide portion 62 corresponds to the linking portion 61 that links one second terminal members 50a and the other second terminal member 50b in a crossing manner.

The second lead portion 56b configuring the other second terminal member 50b includes a thin wall portion 55b having a thickness thinner than that of the external terminal portions 51c and 51d, and the center portion of the thin wall portion 55b is connected to the second lead portion 56a at the linking portion 61 (the wide portion 62).

Similarly to the terminal member 10, the second terminal members 50a and 50b can be formed by etching a metal thin plate such as a copper plate, a copper alloy, an iron nickel alloy plate, or punching out the metal thin plate using a metal mold. In addition, the second terminal members 50a and 50b are formed as a lead frame integrally linked by a tie bar, a support frame or the like (not illustrated) including the terminal member 10, and is separated from the tie bar and the support frame at the time of individualization after sealing with the resin member 58, and then, formed as individual terminals.

The external terminal portion 51a and 51b are disposed along the contour (outer edge) of the resin member 58 having a rectangular plan view shape in a plan view from the Z axis direction, that is, along the two facing sides 58S1 and 58S2 within the outer edge of the sensor unit 1E and are disposed with an interval from each other. The external terminal portions 51a and 51b respectively include the external connection end faces 52a and 52b exposed from the back surface 58r which is the backside surface of the resin member 58. The external terminal portions 51c and 51d are disposed along the contour (outer edge) of the resin member 58 having a rectangular plan view shape in a plan view from the Z axis direction, that is, along the two sides 58S3 and 58S4 facing each other in the outer edge of the sensor unit 1E and are disposed with an interval from each other. The external terminal portions 51c and 51d respectively include the external connection end faces 52c and 52d exposed from the back surface 58r which is the back side surface of the resin member 58. The external terminal portions 51a, 51b, 51c and 51d function as terminal electrodes that connect the external connection end face 52a, 52b, 52c, and 52d, and a connection electrode of the mounting substrate (not illustrated) connecting and fixing the sensor unit 1E.

According to the sensor unit 1E in the sixth embodiment described above, since the second lead portion 56a configuring one second terminal member 50a and the second lead portion 56b configuring the other second terminal member 50b are linked in a crossing manner at the linking portion 61 positioned at the center portion of sensor unit 1E, it is possible to prevent the second terminal members 50a and 50b from being deformed with respect to the force applied to the direction along the intersecting two directions (X axis, Y axis direction in the present embodiment).

By setting the area large, the linking portion 61 can be used as a placing portion (die pad) on which the Gyro device 300, the acceleration sensor device 400 or the like can be placed. By providing such placing portion, the Gyro device 300 or the acceleration sensor device 400 can be placed on the linking portion 61 (placing portion) positioned at the center portion of the sensor unit 1E, and the placed Gyro device 300 or the acceleration sensor device 400 can be shielded by the placing portion.

Modification Example of Terminal Member

Figure 16:
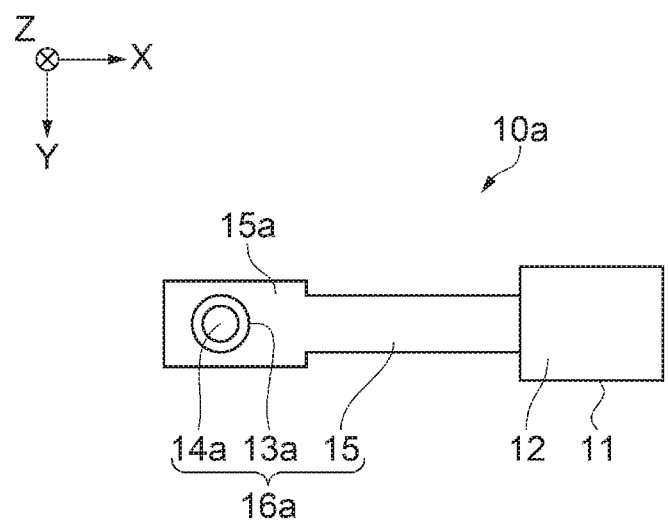
FIG. 16 is a plan view schematically illustrating a terminal member in a modification example 1.
Figure 17:
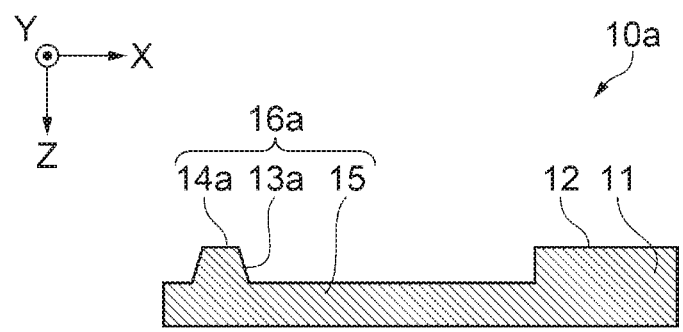
FIG. 17 is a sectional view schematically illustrating the terminal member in the modification example 1.

The configurations of the terminal members 10 and 20 and the second terminal members 30, 40, 50a and 50b in the embodiments described above can be modified in a form of modification example 1 or modification example 2 with reference to the drawings illustrated in FIG. 16 and FIG. 17. Hereinafter, the modification example 1 and the modification example 2 will be sequentially described, and the modification example of the terminal member 10 in the first embodiment will be described as a representative example. The same reference numerals will be given to the same configuration as the terminal member 10 according to in the first embodiment, and the description thereof is omitted.

Modification Example 1

First, the modification example 1 of the terminal members 10 and 20 and the second terminal members 30, 40, 50a and 50b will be described with reference to FIG. 16 and FIG. 17. FIG. 16 is a plan view schematically illustrating a terminal member in the modification example 1. FIG. 17 is a sectional view schematically illustrating the terminal member in the modification example 1.

As illustrated in FIG. 16 and FIG. 17, the terminal member 10a in the modification example 1 includes a lead portion 16a that includes a portion to which the Gyro device 300 (refer to FIG. 4) is connected, and an external terminal portion 11 similar to that in the first embodiment that is continuous to the lead portion 16a and includes an external connection end face 12.

The lead portion 16a includes a thin wall portion 15 having a thickness thinner than the external terminal portion 11, and a protruding portion 13a protruding from the thin wall portion 15 to the external connection end face 12 side (the minus side of the Z axis in the drawing). The thin wall portion 15 has a wide portion 15a positioned at an end side positioned opposite to the external terminal portion 11, and a protruding portion 13a is disposed in the wide portion 15a.

The protruding portion 13a includes a second external connection end face 14a that is disposed within the wide portion 15a of the lead portion 16a and on the plane same as the external connection end face 12 as an end face opposite to the thin wall portion 15. The protruding portion 13a has a so-called tapered shape in which the outer diameter decreases from the thin wall portion 15 toward the second external connection end face 14a.

In the terminal member 10a including the protruding portion 13a in the modification example 1 and the lead portion 16a provided with the external terminal portion 11 also, similarly to the first embodiment, it is possible to achieve the pinning effect against the so-called resin shrinkage stress, which can suppress the movement of the lead portion 16 (the terminal member 10) due to resin shrinkage stress.

Modification Example 2

Figure 18:
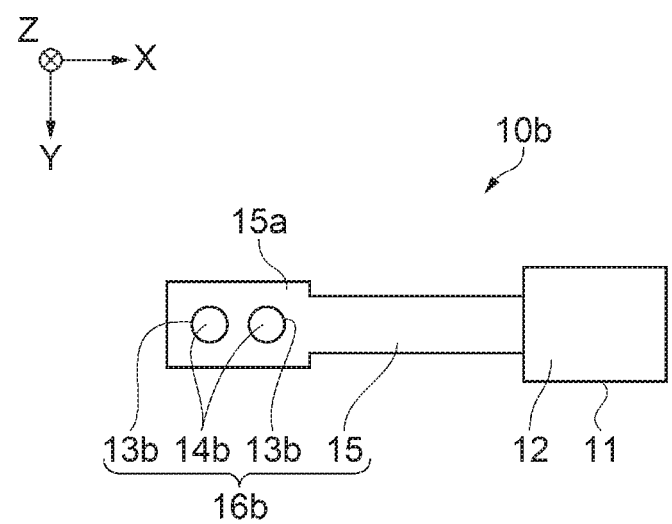
FIG. 18 is a plan view schematically illustrating a terminal member in a modification example 2.
Figure 19:
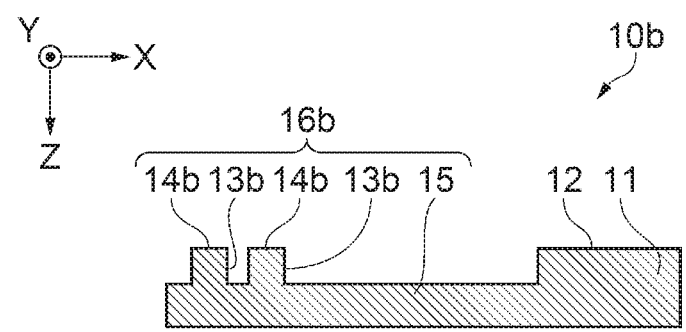
FIG. 19 is a sectional view schematically illustrating the terminal member in the modification example 2.

Next, the modification example 2 of terminal members 10, 20 and second terminal members 30, 40, 50a, and 50b will be described with reference to FIG. 18 and FIG. 19. FIG. 18 is a plan view schematically illustrating the terminal member in the modification example 2. FIG. 19 is a sectional view schematically illustrating the terminal member in the modification example 2.

As illustrated in FIG. 18 and FIG. 19, the terminal member 10b in the modification example 2 includes a lead portion 16b that includes a portion to which a Gyro device 300 (refer to FIG. 4) is connected, and an external terminal portion 11 similar to that in the first embodiment that is continuous to the lead portion 16b and includes the external connection end face 12.

The lead portion 16b includes a thin wall portion 15 having a thickness thinner than the external terminal portion 11, and a plurality (two in the present modification example) of protruding portions 13b protruding from the thin wall portion 15 to the external connection end face 12 side (the minus side of the Z axis in the drawing). The thin wall portion 15 includes a wide portion 15a positioned at an end side positioned opposite to the external terminal portion 11, and two protruding portions 13b are disposed in the middle of the wide portion 15a.

The two protruding portions 13b each include a second external connection end face 14b that is disposed within the wide portion 15a of the lead portion 16b and on the plane same as the external connection end face 12 as an end face opposite to the thin wall portion 15. The two protruding portions 13b are disposed along the longitudinal direction of the wide portion 15a with a certain interval.

By providing the terminal member 10b that includes the lead portion 16b provided with a plurality of protruding portions 13b in the modification example 2, the two protruding portions 13b in the present embodiment, and the external terminal portion 11, the electrical connection and fixing to the mounting substrate (not illustrated) can be reliably performed, and it is possible to effectively achieve the pinning effect.

Also in the second lead portions 36, 46, 56a, 56b in the second terminal members 30, 40, 50a, 50b, a plurality of second protruding portions 33, 43, and 53 may be provided similarly as described above, and thus, the pinning effect of the second terminal members 30, 40, 50a, and 50b (the second lead portions 36, 46, 56a, 56b) by the second protruding portions 33, 43, and 53 can be effectively achieved.

The shapes (the disposition pattern) of the terminal members 10 and 20 and the second terminal members 30, 40, 50a, and 50b in the embodiments described above and the modification, for example, the shapes of the lead portion 16 of the terminal member 10 or the second lead portion 36 of the second terminal member 30 are just examples, and the disposition patterns of the lead portion 16 and the second lead portion 36 are not limited thereto. The disposition patterns of the lead portion 16 and the second lead portion 36 are not limited to the above, and any disposition patterns can be applied.

In addition, in the terminal members 10 and 20 and the second terminal member 30, 40, 50a, and 50b in the embodiments and the modification examples described above, for example, in the terminal member 10, the wide portion 15a and the narrow portion 15b are configured to be included in the thin wall portion 15 of the lead portion 16, but not limited thereto. The thin wall portion 15 may be configured to have the same width without the wide portion 15a and the narrow portion 15b, and in this case, the protruding portion 13 can be provided in the thin wall portion 15 in a position other than the wide portion 15a. Similar configurations can be applied to other terminal members 20 and the second terminal members 30, 40, 50a, and 50b.

Method of Manufacturing Sensor Unit

Figure 20:
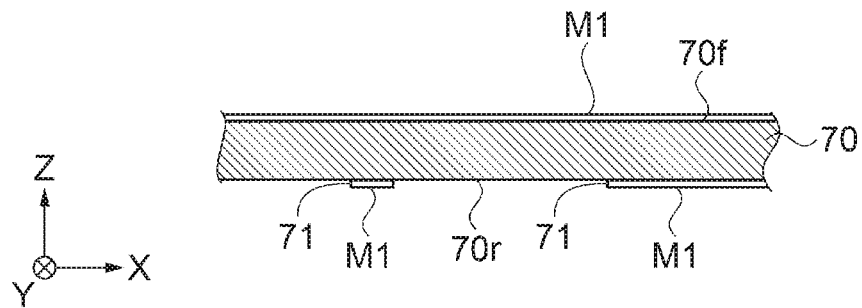
FIG. 20 is a process drawing 1 illustrating a method of manufacturing a sensor unit.
Figure 21:
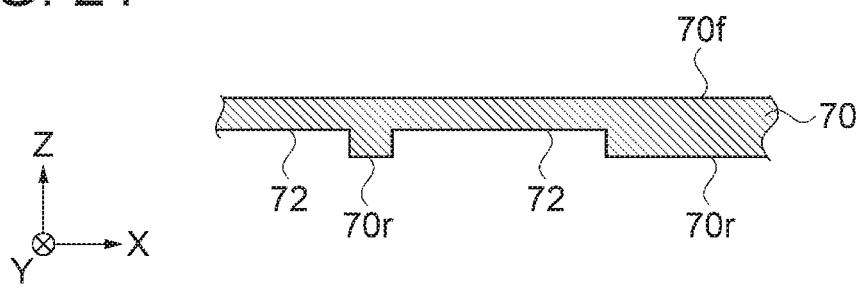
FIG. 21 is a process drawing 2 illustrating a method of manufacturing the sensor unit.
Figure 22:
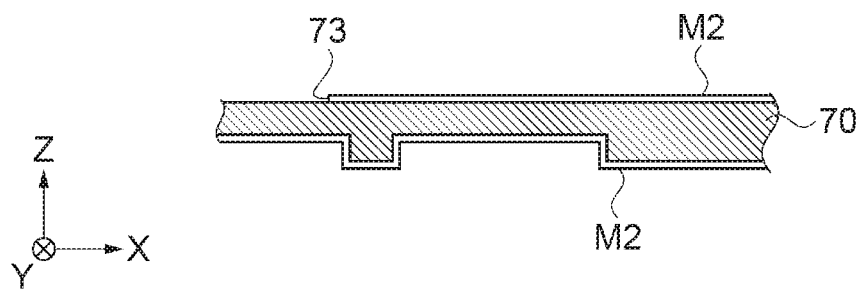
FIG. 22 is a process drawing 3 illustrating a method of manufacturing the sensor unit.
Figure 23:
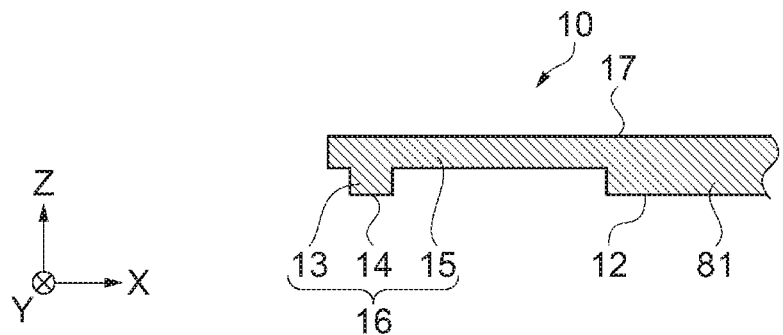
FIG. 23 is a process drawing 4 illustrating a method of manufacturing the sensor unit.
Figure 24:
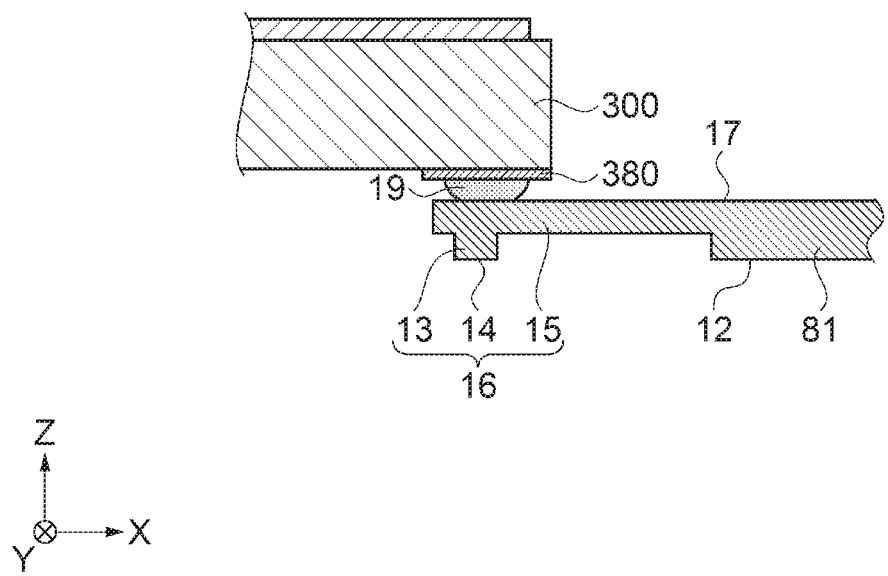
FIG. 24 is a process drawing 5 illustrating a method of manufacturing the sensor unit.
Figure 25:
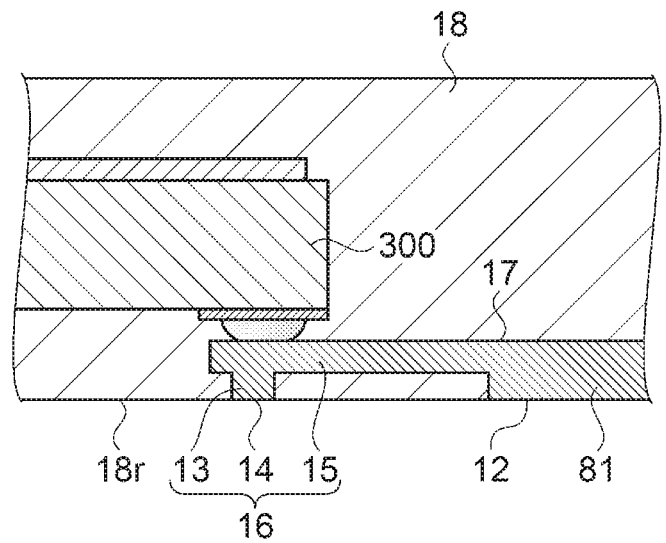
FIG. 25 is a process drawing 6 illustrating a method of manufacturing the sensor unit.
Figure 26:
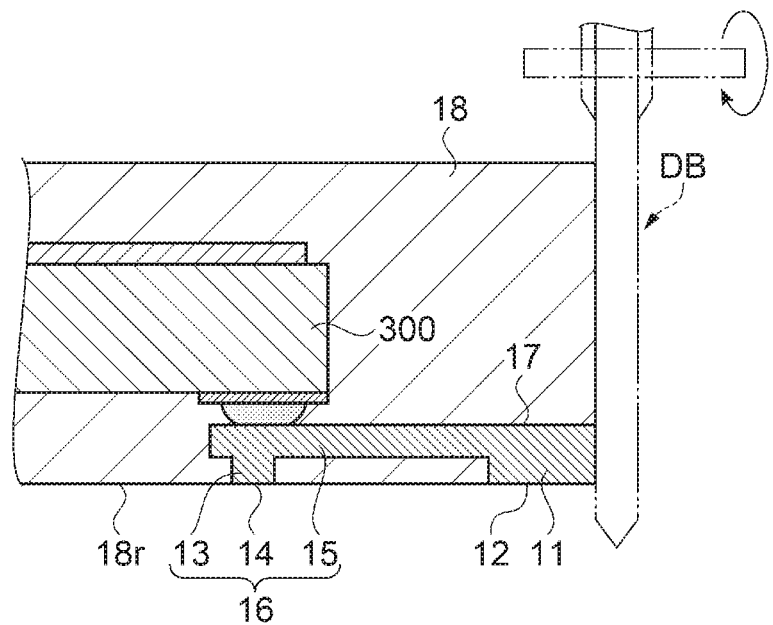
FIG. 26 is a process drawing 7 illustrating a method of manufacturing the sensor unit.

Next, an example of a method of manufacturing the sensor unit will be described with reference to FIG. 20 to FIG. 26. FIG. 20 to FIG. 26 are process drawings illustrating the method of manufacturing the sensor unit, and FIG. 20 illustrates process drawing 1, FIG. 21 illustrates a process drawing 2, FIG. 22 illustrates a process drawing 3, FIG. 23 illustrates a process drawing 4, FIG. 24 illustrates a process drawing 5, FIG. 25 illustrates a process drawing 6, and FIG. 26 illustrates a process drawing 7. In the description for the method of manufacturing the sensor unit, the sensor unit 1 in the first embodiment will be used as an example, and the configuration element name and the reference signs in the first embodiment will be used. In the description here, the sensor unit 1 in the first embodiment will be described as an example, but it can be applicable to other embodiments.

The method of manufacturing the sensor unit 1 illustrated in FIG. 20 to FIG. 26 includes: first etching for forming a thin plate portion 72 including a thin wall portion 15; second etching for forming a lead frame (not illustrated) including a terminal member 10 provided with an external terminal portion 11 and a protruding portion 13; mounting for placing the sensor unit 1 (refer to FIG. 4) on the lead frame; resin forming for placing the resin member 18 so as to cover the sensor unit 1 and a part of the terminal member 10; and individualizing for cutting the lead frame and the resin member 18 covered by the resin member 18.

First, in the first etching, as illustrated in FIG. 20, a first mask M1 provided with an opening portion 71 for forming the thin wall portion 15 (refer to FIG. 4) is formed on a front surface 70f and back surface 70r of the lead frame base material 70. As illustrated in FIG. 21, the lead frame base material 70 provided with the first mask M1 is etched from the opening portion 71 side (the external connection end face 12 side (refer to FIG. 4)) of the first mask M1, and thereafter, a thin plate portion 72 including the thin wall portion 15 is formed by removing the first mask M1. As the etching processing in the first etching, half etching processing can be applied.

Next, as illustrated in FIG. 22, in second etching, a second mask M2 provided with an opening portion 73 for forming the terminal member 10 (refer to FIG. 4) is formed on a surface of the lead frame base material 70 on which the thin plate portion 72 including the thin wall portion 15 is formed. As illustrated in FIG. 23, the etching processing is performed on the lead frame base material 70 provided with the second mask M2 from the opening portion 73 side of the second mask M2, and then, a lead frame 81 including the terminal member 10 provided with the protruding portion 13 protruding from the thin wall portion 15, which has a portion having an external connection end face 12 and later becoming an external terminal portion 11 (refer to FIG. 4) and a second external connection end face 14. As the etching processing in the second etching, full etching processing can be applied.

Next, as illustrated in FIG. 24, in mounting, the Gyro device 300 is mounted on the front surface 17 of the lead frame 81 on the side opposite to the protruding side of the protruding portion 13 through the electrical connection. Here, the Gyro device 300 is mounted on a position overlapping the protruding portion 13 and not overlapping the external terminal portion 11. In the Gyro device 300, a corresponding external terminal 380 is fixed on the front surface 17 of the lead portion 16 which is a side opposite to the external connection end face 12 by the electrical connection using the joining member 19 such as conductive adhesive.

Next, as illustrated in FIG. 25, in resin forming, the resin member 18 is disposed so as to cover the Gyro device 300 placed on the lead frame 81 and a part (in the present example, a portion excluding the external connection end face 12 and the second external connection end face 14) of the plurality of terminal members 10. For the resin member 18 as an insulation member having the electrical insulation properties, a resin molding method such as a transfer method or a compression method can be applied, in which the resin molding is performed by clamping the lead frame 81 into the resin molding die (not illustrated). At this time, in the terminal member 10, since the protruding portion 13 protruding from the thin wall portion 15 to the external connection end face 12 side is provided, the protruding portion 13 functions as a support for the resin molding die and the thin wall portion 15 is provided, and thus, it is possible to prevent the lead portion 16 (thin wall portion 15) from being deformed, to which the massive Gyro device 300 is connected and it is easy to be bent.

Next, as illustrated in FIG. 26, in individualizing, the lead frame 81 covered by the resin member 18 and the resin member 18 are cut and divided, and then, the individualized sensor unit 1 can be obtained. For cutting the lead frame 81 covered by the resin member 18 and the resin member 18, for example, a dicing machine (not illustrated) or the like can be used to cause the rotating dicing blade DB to come in contact to the lead frame 81 covered by the resin member 18 and the resin member 18.

According to the process described above, it is possible to obtain the sensor unit 1 that includes a plurality of terminal members 10 in each of which the external terminal portion 11 having the external connection end face 12 is linked to the lead portion 16 that includes the thin wall portion 15 having a thickness thinner than the external terminal portion 11 and the protruding portion 13 protruding from the thin wall portion 15 to the external connection end face 12 side, the Gyro device 300 to which each of the external terminals 380 that are a plurality of connection terminals is connected to a plurality of terminal members 10 respectively, and the resin member 18 covering the Gyro device 300 and a part of the plurality of terminal members 10.

Here, in the process described above, since the thin wall portion 15 of the lead portion 16 having a thickness thinner than that of the external terminal portion 11 is weak in strength, the mass of the connected Gyro device 300 and a shock during handling cause the deformation of the lead portion 16. Such a deformation of the lead portion 16 is likely to occur as the mass of the Gyro device 300 or the like increases, however, according to the method of manufacturing the sensor unit 1 described in the present embodiment, in the terminal member 10 formed as the lead frame 81 by the first etching and the second etching, since the protruding portion 13 protruding from the thin wall portion 15 toward the second external connection end face 14 is provided, the protruding portion 13 functions as a support and can prevent the lead portion 16 from being deformed.

In addition, for example, if a plurality of sensor devices in the second embodiment are mounted, for example, if the Gyro device 300 and the acceleration sensor device 400 (refer to FIG. 7) are mounted, the mass of the Gyro device 300 and the acceleration sensor device 400 increases in the sensor unit 1A packaged by resin member 18. Therefore, the deformation of the lead portion 16 is likely to occur, and thus, it is possible to achieve a more remarkable effect of preventing the deformation.

Application Example of Method of Manufacturing

Figure 27:
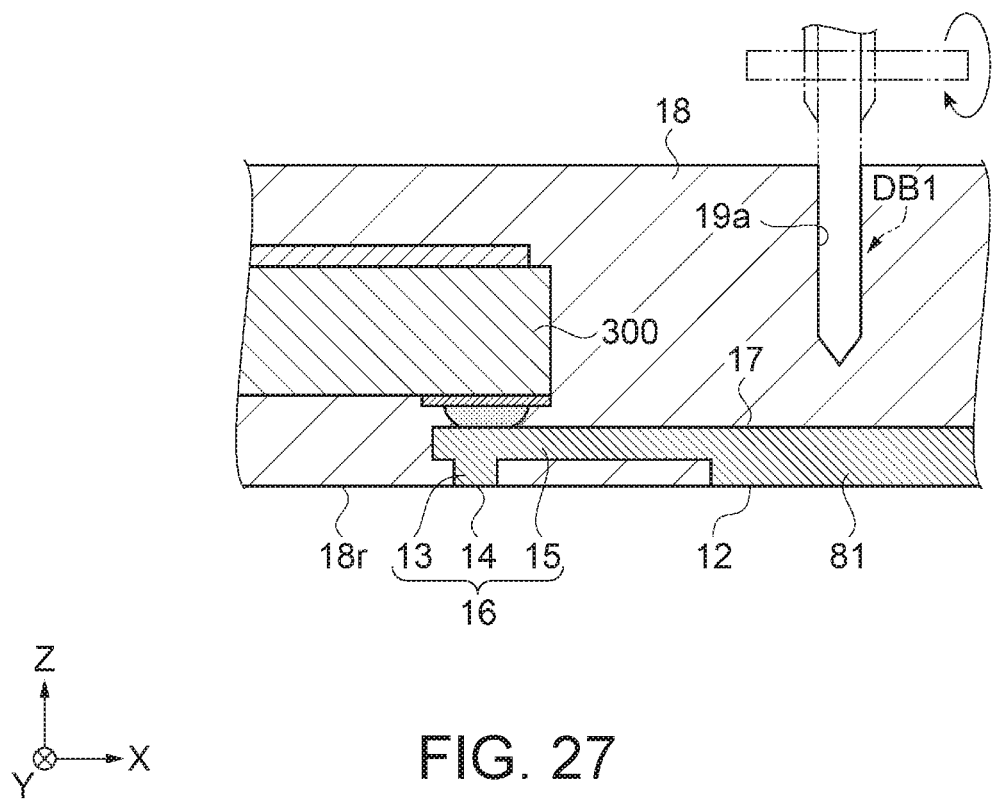
FIG. 27 is a process drawing 1A illustrating a method of manufacturing a sensor unit in an application example.
Figure 28:
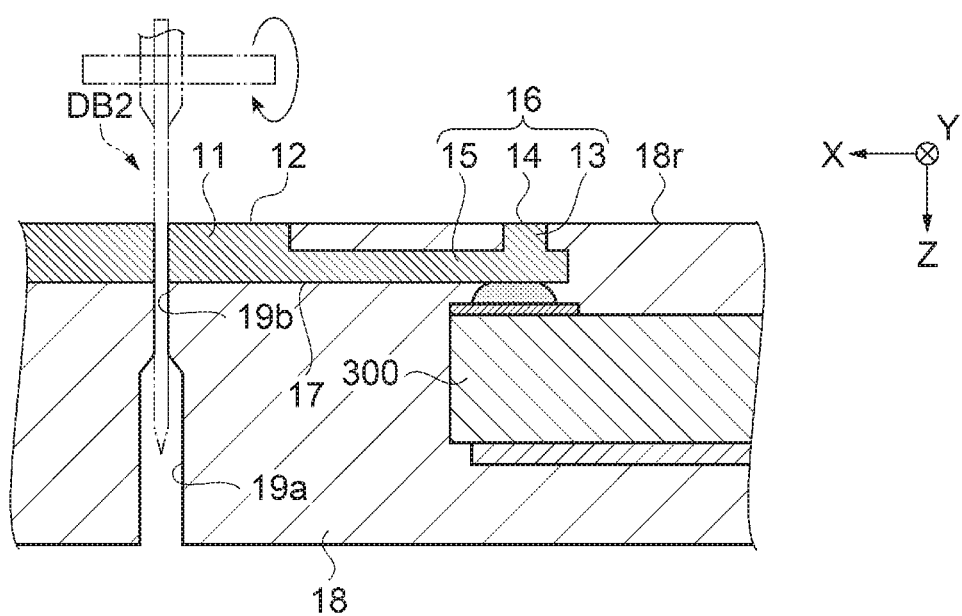
FIG. 28 is a process drawing 2A illustrating a method of manufacturing the sensor unit in an application example.

In addition, in the individualizing, it is possible to cut and divide the lead frame 81 covered by the resin member 18 and the resin member 18, the individualized sensor unit 1 can be obtained using a method in the application example illustrated in FIGS. 27 and 28. FIG. 27 is a process drawing 1A illustrating the method of manufacturing the sensor unit in the application example. FIG. 28 is a process drawing 2A illustrating the method of manufacturing the sensor unit in the application example.

In individualizing in the method of manufacturing the sensor unit 1 in the application example, the lead frame 81 covered by the resin member 18 and the resin member 18 are cut and divided using two types of dicing blades DB1 and DB2.

First, as illustrated in FIG. 27, by causing the rotating dicing blade DB1 to come in contact with the resin member 18 from the side opposite to the disposition side of the lead frame 81 using the dicing blade DB1 having a relatively large thickness and strength, a notch 19a is formed to the middle of the resin member 18, specifically to the resin member 18, for example, ½ to ⅔ of the thickness of the resin member 18 up to the nearest position to the lead frame 81.

Next, as illustrated 28, by causing the rotating dicing blade DB2 to come in contact with the lead frame 81 and the resin member 18 illustrated in FIG. 27 from the side opposite to the contact side of the dicing blade DB1 using the dicing blade DB2 thinner than the dicing blade DB1, the remaining lead frame 81 and the resin member 18 are removed, and a groove portion 19b penetrating the back surface 18r and the notch 19a is formed. In this way, the lead frame 81 covered by the resin member 18 and the resin member 18 can be cut, and the individualized sensor unit 1 can be obtained.

In a package with a tall resin member 18 enclosing a large device such as Gyro device 300, if the dicing blade DB2 which is thin in thickness is used, bending of the dicing blade DB2 and the like occurs and it is impossible to realize a desired external shape, or the dicing blade DB2 is intensely worn out, and thus, it is difficult to perform cutting due to the frequent exchange of the dicing blade, or the like. On the other hand, by applying the individualizing using the two kinds of dicing blades DB1 and DB2 as described above, even in the tall resin member 18, the dicing blade can be prevented from bending by using the thick dicing blade DB1, and it is possible to prevent a general thin dicing blade DB2 from being worn out, and thus, cutting can be easily performed.

As described above, if cutting is performed using the thick dicing blade DB1 and the dicing blade DB2 having a thickness thinner than that of the dicing blade DB1, a stepped shape is made, in which the portion of the outer circumferential side surface of the resin member 18 that comes in contact with the dicing blade DB1 has a step that is recessed to the portion that comes in contact with the dicing blade DB2.

Inertial Measurement Device

Figure 29:
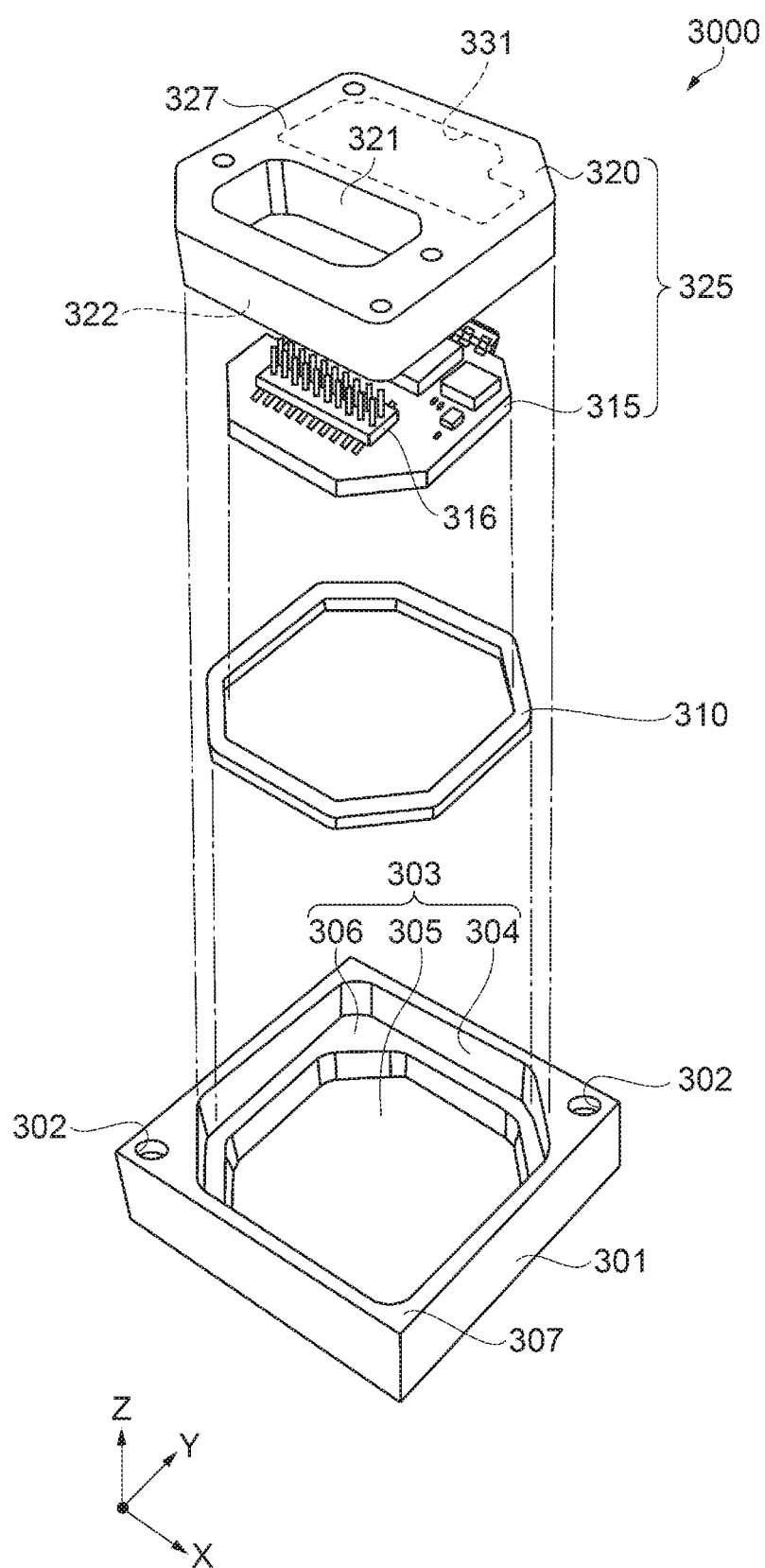
FIG. 29 is an exploded perspective view illustrating a schematic configuration of an inertial measurement unit.
Figure 30:
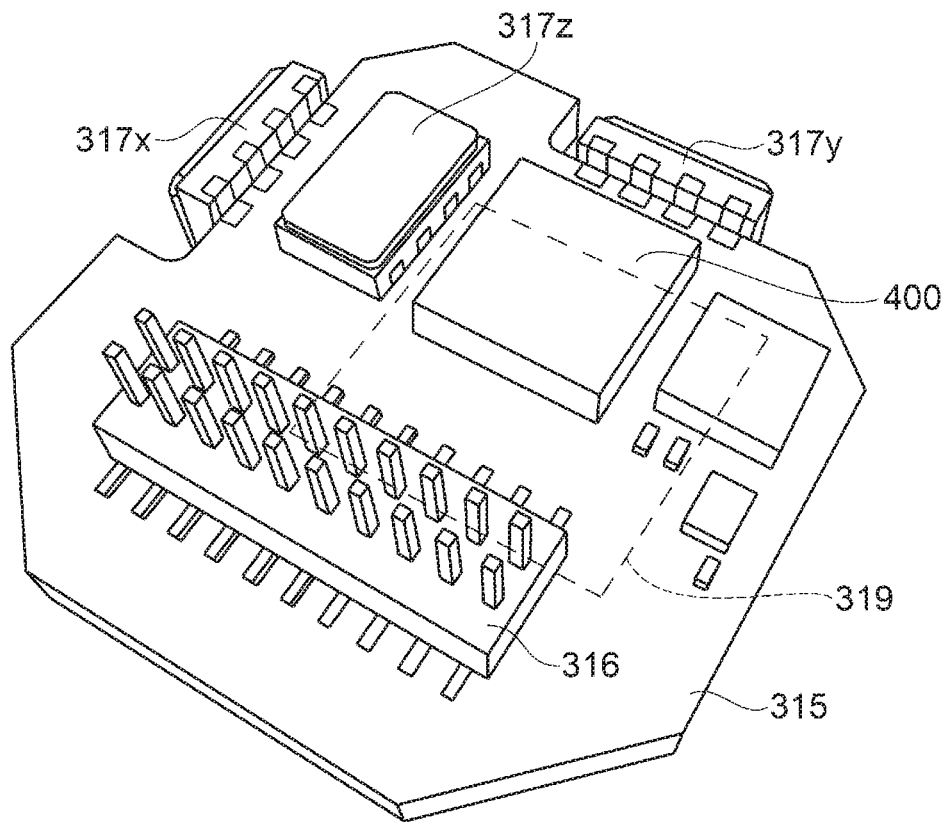
FIG. 30 is a perspective view illustrating a disposition example of inertial sensor elements of the inertial measurement unit.

Next, an inertial measurement unit (IMU) as an inertial measurement device will be described with reference to FIG. 29 and FIG. 30. FIG. 29 is an exploded perspective view illustrating a schematic configuration of the inertial measurement unit. FIG. 30 is a perspective view illustrating a disposition example of inertial sensor elements of the inertial measurement unit. Hereinafter, an example in which the sensor unit 1 is used as angular velocity sensors 317x, 317y, and 317z will be described.

As illustrated in FIG. 29, an inertial measurement unit 3000 as the inertial measurement device is configured to include an outer case 301, a joining member 310, a sensor module 325 including inertial sensor elements, and the like. In other words, the sensor module 325 is engaged (inserted) in the inner portion 303 of the outer case 301 with the joining member 310 interposed therebetween. The sensor module 325 is configured with an inner case 320 and a substrate 315. In order to make the description easier to understand, the portion name is set as the outer case and the inner case, but the name may be changed to be called as a first case and a second case.

The outer case 301 is a pedestal made by cutting out aluminum into a box shape. The material is not limited to the aluminum, but other metals such as zinc or stainless steel, resin, a composite material of a metal or the resin, or the like may be used. The outer shape of the outer case 301 is a rectangular parallelepiped having a substantially square planar shape similarly to the overall shape of the inertial measurement unit 3000 described above, and through holes (stagger holes) 302 are respectively formed in the vicinity of two apexes positioned in the diagonal direction of the square. Not limited to the through holes (stagger hole) 302, for example, a configuration in which a notch (a structure in which a notch is formed at each of the corner portions of the outer case 301 where the through holes (stagger hole) 302 are positioned) capable of being screwed by screws is formed and screwed, alternatively, a flange (ears) may be formed on the side surface of the outer case 301, and the flange portion may be screwed.

The outer case 301 has a rectangular parallelepiped shape and a box shape without a lid, and an inner portion 303 (inner side) thereof is an internal space (container) surrounded by a bottom wall 305 and a side wall 304. In other words, the outer case 301 has a box shape with one side facing the bottom wall 305 as an opening side, and the sensor module 325 is accommodated therein such that most of the opening portion on the opening side is covered (so as to block the opening portion), and the sensor module 325 is exposed from the opening portion (not illustrated). Here, the opening side facing the bottom wall 305 is the surface same as an upper surface 307 of the outer case 301. In addition, the planar shape of the inner portion 303 of the outer case 301 is a hexagon with corners at two apex portions of the square are chamfered, and the two chamfered apex portions are corresponding to the positions of the through holes (stagger holes) 302. In addition, in the cross-sectional shape (thickness direction) of the inner portion 303, a first joining surface 306 as a bottom wall which is one step higher than the center portion is formed at the circumferential portion in the inner portion 303, that is, in the internal space on the bottom wall 305. In other words, the first joining surface 306 is a part of the bottom wall 305, and is a portion having a step shape of one step formed in a ring shape surrounding the center portion of the bottom wall 305 in a planar view, and is a surface to which a distance from the opening side (the surface same as the upper surface 307) is shorter than the distance to the bottom wall 305.

The outer case 301 has a rectangular parallelepiped shape with a substantially square planar shape and has box shape without the lid, but not limited to this example, the planar shape of the outer shape of the outer case 301 may be a polygonal shape such as a hexagon or an octagon, for example, the corners of the apex portions of the polygon may be chamfered, or each side of the planar shape may be a curved line. In addition, the planar shape of the inner portion 303 (inner side) of the outer case 301 is not limited to the hexagon described above, but may be a square (quadrangle) such as a square or another polygonal shape such as an octagon. In addition, the outer shape of the outer case 301 and the planar shape of the inner portion 303 may be similar to each other or not.

The inner case 320 is a member for supporting the substrate 315 and has a shape to fit in the inner portion 303 of the outer case 301. Specifically, in a plan view, the inner case 320 has a hexagon in which the corners of two apex portions of a square are chamfered, and an opening portion 321 which is a rectangular through hole and a recessed portion 331 provided on the surface of a side supporting the substrate 315 are formed therein. The two chamfered apex portions correspond to the positions of the through holes (stagger holes) 302 of the outer case 301. The height in the thickness direction (Z axis direction) of the inner case 320 is lower than the height from the upper surface 307 to the first joining surface 306 of the outer case 301. In the preferred example, the inner case 320 is also formed by cutting out the aluminum, but other materials may be used similarly to the outer case 301.

A guide pin for positioning the substrate 315 and a supporting surface (none of which are illustrated) are formed on the back surface (the surface on the outer case 301 side) of the inner case 320. The substrate 315 is set (positioned and mounted) on the guide pin and the supporting surface and adhered to the back surface of the inner case 320. Details of the substrate 315 will be described later. The circumferential portion of the back surface of the inner case 320 is a second joining surface 322 having a ring-shaped plane. The second joining surface 322 has a substantially same shape as the first joining surface 306 of the outer case 301 in a plan view, and when the inner case 320 is set in the outer case 301, the two surfaces face each other with the joining member 310 being clamped. The structure of the outer case 301 and the inner case 320 is an example, and is not limited thereto.

A configuration of the substrate 315 on which an inertial sensor is mounted will be described with reference to FIG. 30. As illustrated in FIG. 30, the substrate 315 is a multilayer substrate on which a plurality of through holes are formed, and a glass epoxy substrate is used. Not limited to the glass epoxy substrate, but a rigid substrate on which a plurality of inertial sensors, electronic components, connectors and the like can be mounted may be used. For example, a composite substrate or a ceramic substrate may be used.

On the front surface (the surface on the inner case 320 side) of the substrate 315, a connector 316, an angular velocity sensor 317z (the sensor unit 1), an acceleration sensor device 400 and the like are mounted. The connector 316 is a plug type (male) connector and has two rows of connection terminals disposed at an equal pitch in the X axis direction. Preferably, the connection terminals of total 20 pins in two rows with 10 pins in one row are used, but the number of terminals may be appropriately changed according to design specifications.

The angular velocity sensor 317z as an inertial sensor is a gyro sensor that measures one axis angular velocity in the Z axis direction. As a preferable example, a vibrating gyro-sensor is used, which uses quartz crystal as an vibrator and measures the angular velocity from the Coriolis force applied to the vibrating object. Not limited to the vibrating gyro-sensor, but any sensor capable of measuring the angular velocity may be used. For example, a sensor using ceramics or silicon may be used as the vibrator.

In addition, on the side surface of the substrate 315 in the X axis direction, an angular velocity sensor 317x (the sensor unit 1) for measuring one axis angular velocity in the X axis direction is mounted such that the mounting surface becomes perpendicular to the X axis. Similarly, on the side surface of the substrate 315 in the Y axis direction, an angular velocity sensor 317y (the sensor unit 1) for measuring one axis angular velocity in the Y axis direction is mounted such that the mounting surface becomes perpendicular to the Y axis.

For example, the sensor unit 1 described above can be used as the angular velocity sensors 317x, 317y, and 317z. In addition, not limited to the configuration using three angular velocity sensors for each axis, any sensor capable of measuring three angular velocities may be used, and a sensor device capable of measuring (detecting) three angular velocities in one device (packaged) may be used.

The acceleration sensor device 400 is configured to use a static capacitance type acceleration sensor element (not illustrated) which is obtained, for example, by processing a silicon substrate using MEMS technology and can measure (detect) the acceleration in three directions (three axes) of X axis, Y axis, and Z axis using one device. According to the necessity, an acceleration sensor device 400 to which an acceleration sensor element capable of measuring the accelerations in two axial directions of X axis and Y axis or an acceleration sensor element capable of measuring the acceleration in one axial direction is applied may be used.

A control IC (control circuit) 319 as a control unit is mounted on the back surface (the surface on the outer case 301 side) of the substrate 315. The control IC 319 is a micro controller unit (MCU) in which a storage unit including a nonvolatile memory and an A/D converter are embedded, and performs control of each part of the inertial measurement unit 3000 including the control of the angular velocity sensors 317x, 317y, and 317z and the acceleration sensor device 400. A program specifying the order and content for measuring the acceleration and the angular velocity, a program for digitizing the measured data and incorporating the data into packet data, and accompanying data, and the like are stored in the storage unit. A plurality of other electronic components are mounted on the substrate 315.

According to the inertial measurement unit 3000 as such an inertial measurement device, since the sensor unit 1 in the first embodiment having the stable characteristics is used, in which the stress due to the expansion and shrinkage of the resin member 18 is decreased by the terminal member 10 on which the lead portion 16 of the branched columnar member buried in the resin member 18 is configured, it is possible to improve the measurement stability of the inertial measurement unit 3000.

Electronic Apparatus

Next, an electronic apparatus using sensor units 1, 1A, 1B, 1C, 1D and 1E will be described in detail with reference to FIG. 31 to FIG. 33. Hereinafter, an example using the sensor unit 1 will be described.

A mobile type personal computer that is an example of the electronic apparatus will be described with reference to FIG. 31. FIG. 31 is a perspective view schematically illustrating a configuration of the mobile type personal computer which is an example of the electronic apparatus.

In the drawing, a personal computer 1100 is configured with a main body portion 1104 including a keyboard 1102 and a display unit 1106 including a display portion 1108. The display unit 1106 is rotatably supported with respect to the main body portion 1104 via a hinge structure portion. In such a personal computer 1100, a sensor unit 1 functioning as an angular velocity sensor is embedded, and the control unit 1110 can perform the control such as the attitude control based on the measurement data from the sensor unit 1.

Figure 32:
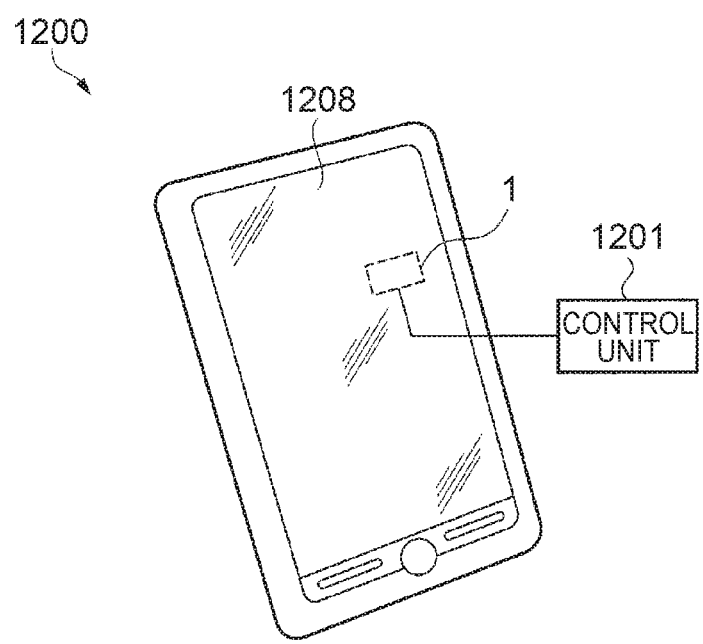
FIG. 32 is a perspective view schematically illustrating a configuration of a smartphone (mobile phone) which is an example of the electronic apparatus.

FIG. 32 is a perspective view schematically illustrating a configuration of a smartphone (mobile phone) which is an example of the electronic apparatus.

In the drawing, the sensor unit 1 described above is embedded in a smart phone 1200. Measurement data (angular velocity data) measured by the sensor unit 1 is transmitted to a control unit 1201 of the smart phone 1200. The control unit 1201 is configured to include a central processing unit (CPU) and recognizes the attitude and behavior of the smart phone 1200 from the received measurement data, and then, can change the display image displayed on the display portion 1208 or can output a warning sound or sound effect, or drive the vibration motor to vibrate the main body. In other words, the control unit 1201 can perform motion sensing of the smart phone 1200, and then, can change the display, or output the sound, vibration, and the like from the measured attitude and behavior. In particular, when executing a game application, it is possible to enjoy realistic feeling close to the reality.

Figure 33:
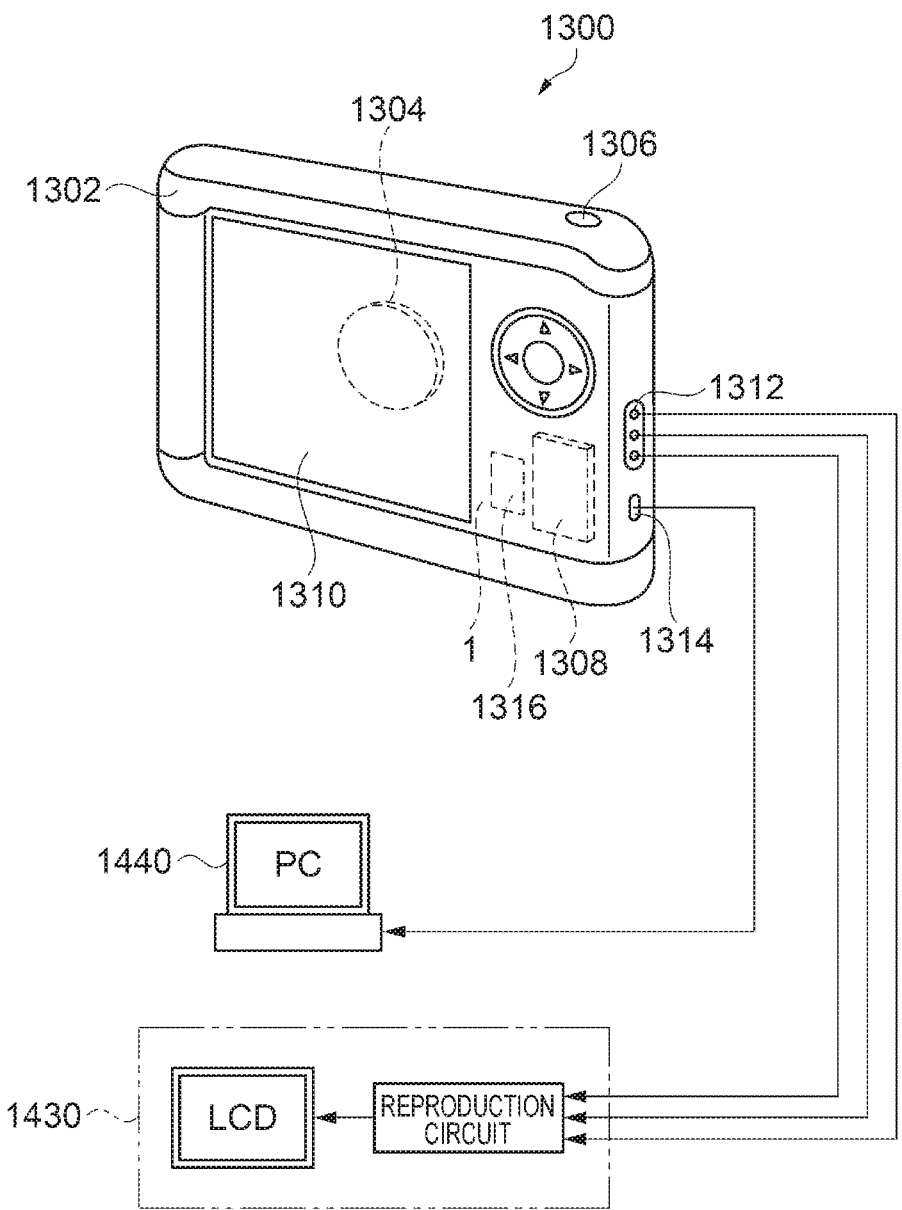
FIG. 33 is a perspective view illustrating a configuration of a digital still camera which is an example of the electronic apparatus.

FIG. 33 is a perspective view illustrating a configuration of a digital still camera which is an example of the electronic apparatus. In the drawing, connection to an external device is also briefly illustrated.

A display portion 1310 is provided on a rear surface of a case (body) 1302 of a digital still camera 1300, and the display is performed based on an image signal by a CCD, and the display portion 1310 also functions as a viewfinder for displaying the subject as an electronic image. A light receiving unit 1304 including an optical lens (image pickup optical system), the CCD and the like is provided on a front surface side (back surface side in the figure) of the case 1302.

When a photographer confirms the subject image displayed on the display portion 1310 and presses a shutter button 1306, the image signal of the CCD at that time is transferred and stored in the memory 1308. In addition, in the digital still camera 1300, a video signal output terminal 1312 and an input/output terminal 1314 for data communication are provided on the side surface of the case 1302. As illustrated, a television monitor 1430 is connected to the video signal output terminal 1312, and a personal computer 1440 is connected to the input/output terminal 1314 for data communication, as necessary. Furthermore, the image signal stored in the memory 1308 is output to the television monitor 1430 or the personal computer 1440 by a predetermined operation. In such a digital still camera 1300, the sensor unit 1 functioning as an angular velocity sensor is embedded, and the control unit 1316 can perform control such as a camera shake correction based on the measurement data from the sensor unit 1.

The electronic apparatus described above includes the sensor unit 1 and the control units 1110, 1201, 1316, and thus, the apparatus has an excellent reliability.

Figure 31:
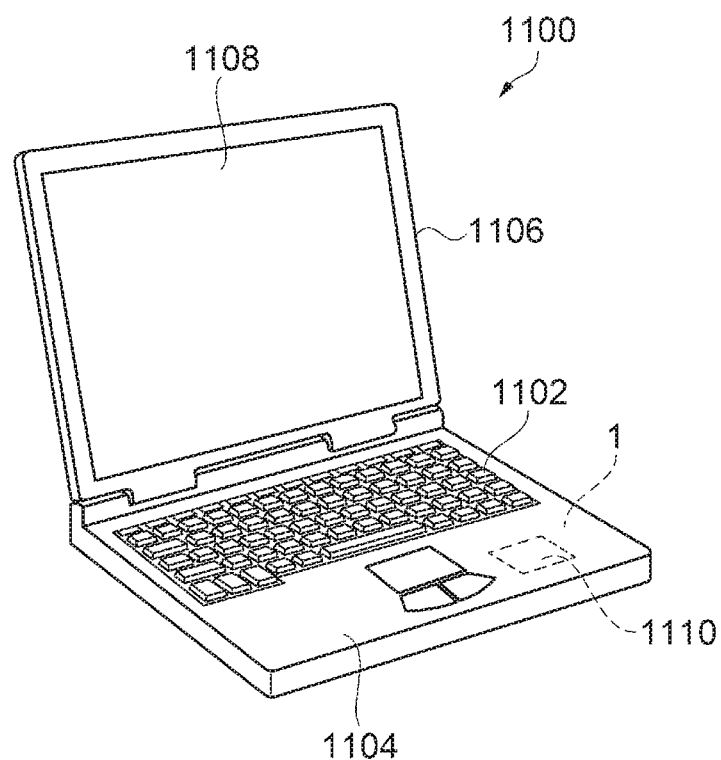
FIG. 31 is a perspective view schematically illustrating a configuration of a mobile type personal computer which is an example of an electronic apparatus.

In addition to the personal computer in FIG. 31, the smart phone (mobile phone) in FIG. 32, and the digital still camera in FIG. 33, the electronic apparatus that includes the sensor unit 1 can be applied to, for example, a tablet terminal, a watch, an inkjet type discharging device (for example, an inkjet printer), a laptop type personal computer, a television set, a video camera, a video tape recorder, a car navigation device, a pager, an electronic diary book (including communication function), an electronic dictionary, an electronic calculator, an electronic game machine, a word processor, a workstation, a video phone, a television monitor for security, an electronic binocular, a POS terminal, medical equipment (for example, an electronic clinical thermometer, a blood pressure monitor, a blood glucose meter, an electrocardiogram measuring device, an ultrasonic diagnostic device, an electronic endoscope), a fish finder, various measuring instruments, instruments (for example, instruments of a vehicle, an aircraft, a ship), a flight simulator, a seismograph, a pedometer, an inclinometer, a vibrometer that measures vibration of a hard disk, an attitude control device of a robot and flying object such as a drone, a control device used for inertial navigation for the autonomous driving.

Vehicle

Figure 34:
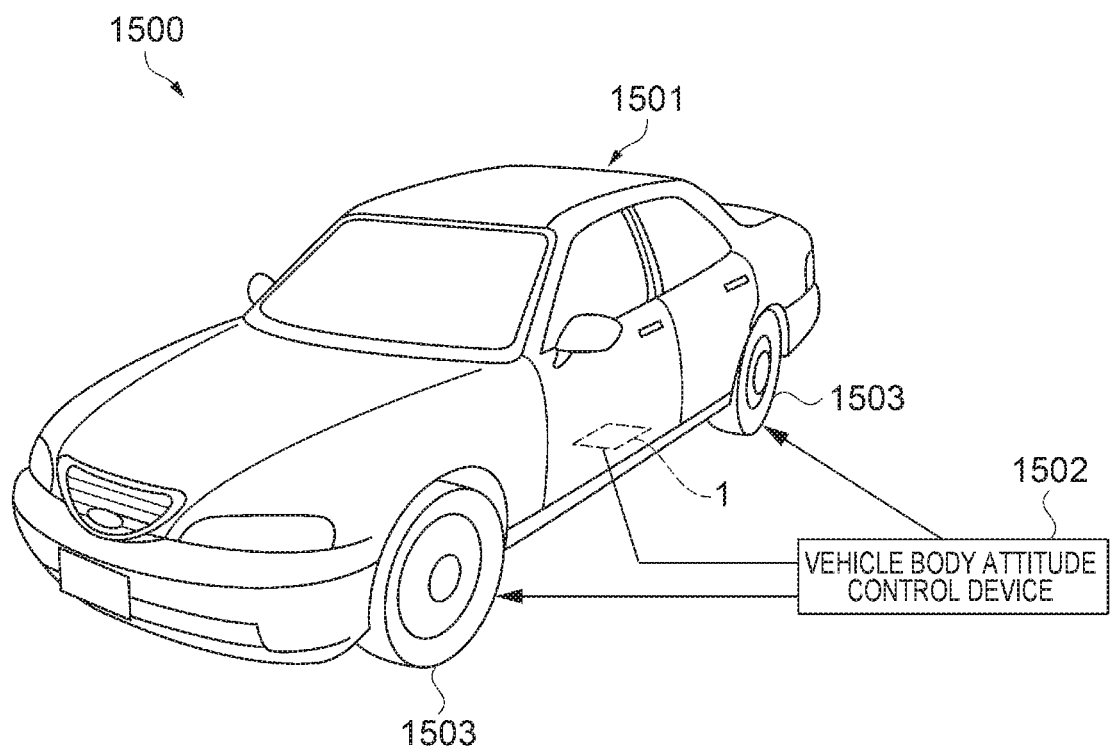
FIG. 34 is a perspective view illustrating a configuration of an automobile which is an example of a vehicle.

Next, an example in which the sensor unit 1 is used as a representative example for a vehicle using sensor units 1, 1A, 1B, 1C, 1D, or 1E is illustrated in FIG. 34, and will be described in detail. FIG. 34 is a perspective view illustrating a configuration of an automobile which is an example of a vehicle.

As illustrated in FIG. 34, the sensor unit 1 is embedded in an automobile 1500, and for example, the attitude of a vehicle body 1501 can be detected by the sensor unit 1. The detection signal from the sensor unit 1 is supplied to a vehicle body attitude control device 1502 as an attitude control unit for controlling the attitude of the vehicle body, the vehicle body attitude control device 1502 can detect the attitude of the vehicle body 1501 based on the signal, and can control the hardness of the suspension according to the detection result, and can control the brakes of the individual wheels 1503. In addition, the sensor unit 1 can widely applied to an electronic control unit (ECU) for a keyless entry, an immobilizer, a car navigation system, a car air conditioner, an anti-lock braking system (ABS), an air bag, a tire pressure monitoring system (TPMS), an engine control, a control device of inertial navigation control for autonomous driving, a battery monitor of a hybrid automobile and an electric automobile.

In addition to the examples described above, the sensor unit 1 adopted to the vehicle can be applied to the attitude control of a biped walking robot or a train, an attitude control of a remote control for radio control airplane, radio control helicopter, and drone, or an attitude control of an autonomous aircraft, and an attitude control of an agricultural machine or a construction machine or the like. As described above, in realizing the attitude control of various vehicles, the sensor unit 1 and each control unit (not illustrated) are embedded.

The vehicles described above include the control unit (not illustrated) such as the sensor unit 1 and the vehicle body attitude control device 1502, and thus, the vehicles have an excellent reliability.

As described above, the sensor unit, the inertial measurement device, the electronic apparatus, and the vehicle are described based on the illustrated embodiments. However, the invention is not limited to thereto, and the configurations of each part can be replaced by any configurations having the similar functions. In addition, any other configuration elements may be added to the invention.

What is claimed is:

1. A sensor unit component comprising:
   three axes orthogonal to each other being defined as an X axis, a Y axis, and a Z axis;
   a plurality of first terminal members, each of the plurality of first terminal members being configured with:
      a main lead extending along an X-Y plane of the X axis and the Y axis, the main lead having an inner edge and an outer edge;
      a protrusion protruding from a bottom of the main lead along the Z axis;
      an external connector extending from the outer edge of the main lead along the X-Y plane; and
      a thin wall portion of the main lead located between the protrusion and the external connector when viewed along the Z axis;
   a sensor device connected to a top surface of each of the plurality of first terminal members via a conductive material; and
   a resin member that covers the sensor device and a part of the plurality of first terminal members,
   wherein a thickness along the Z axis of the thin wall portion is thinner than a thickness along the Z axis of the external connector,
   the sensor device is overlapped with the protrusion when viewed along the Z axis, and the sensor device is not overlapped with the external connector when viewed along the Z axis, and
   the conductive material is overlapped with the protrusion when viewed along the Z axis.

2. The sensor component according to claim 1,
   wherein a first bottom surface of the external connector exposes to an outside of the sensor component, and
   a second bottom surface of the protrusion exposes to the outside of the sensor component and is disposed on a plane same as the first bottom surface of the external connector.

3. The sensor component according to claim 2,
   wherein an area of the first bottom surface of the external connector is S1,
   an area of the second bottom surface of the protrusion is S2, and $0.3<S2/S1<2$.

4. The sensor component according to claim 2,
   wherein an area of the first bottom surface of the external connector is S1,
   an area of the second bottom surface of the protrusion is S2, and $0.1<S2/S1<1$.

5. An inertial measurement device comprising:
   the sensor component according to claim 2; and
   a control circuit that controls driving of the sensor component.

6. An electronic apparatus comprising:
   the sensor component according to claim 2; and
   a controller that performs control based on a detection signal output from the sensor component.

7. The sensor component according to claim 1,
   wherein the thickness along the Z axis of the external connector is H1,
   a thickness along the Z axis of a portion including the protrusion and the main lead portion that is located directly above the protrusion is H2, and $0.8<H2/H1<1$.

8. The sensor component according to claim 7,
   wherein the protrusion is covered by an insulation member having electrical insulation properties.

9. The sensor component according to claim 1,
   wherein the protrusion of each of the plurality of first terminal members is configured with a plurality of protrusions.

10. The sensor component according to claim 1,
    wherein a contour of the resin member has a rectangular shape when viewed along the Z axis.

11. The sensor component according to claim 1, further comprising:
    a second terminal member that is different from the plurality of first terminal members and that is not connected to the sensor device,
    wherein the second terminal member includes an extension portion disposed along a contour of the sensor device when viewed along the Z axis.

12. The sensor component according to claim 1, further comprising:
    a second terminal member that is different from the plurality of first terminal members and that is not connected to the sensor device,
    wherein a contour of the resin member has a rectangular shape when viewed along the Z axis,
    wherein the second terminal member includes,
       a pair of second external connectors disposed along two different sides of the rectangular contour, and
       a second lead linking the pair of second external connectors each other, and
    wherein the second lead includes,
       a second thin wall portion, a thickness along the Z axis of the second thin wall portion is thinner than a thickness along the Z axis of each of the pair of second external connectors, and
       a second protrusion protruding from the second thin wall portion along the Z axis.

13. The sensor component according to claim 12,
    wherein the sensor device is configured with a plurality of sensor devices that are disposed at positions separated from each other when viewed along the Z axis, and
    the second lead is disposed between adjacent two sensor devices of the plurality of sensor devices when viewed along the Z axis.

14. The sensor component according to claim 12,
    wherein the second terminal member is configured with a plurality of second terminal members, and the second lead is configured with a plurality of second leads corresponding to the plurality of second terminal members, and
    the plurality of second leads of at least three members of the plurality of second terminal members are connected via a linking member that is located at a center of the sensor component when viewed along the Z axis.

15. The sensor component according to claim 14,
    wherein the linking member includes a placing portion on which the sensor device is placed.

16. The sensor component according to claim 12,
    wherein the second protrusion is configured with a plurality of second protrusions.

17. An inertial measurement device comprising:
    the sensor component according to claim 1; and
    a control circuit that controls driving of the sensor component.

18. An electronic apparatus comprising:
    the sensor component according to claim 1; and a controller that performs control based on a detection signal output from the sensor component.

19. A vehicle comprising:

the sensor component according to claim 1; and an attitude controller that controls an attitude based on a detection signal output from the sensor component.

* * * * *